United States Patent
Wang et al.

(10) Patent No.: US 9,276,547 B2
(45) Date of Patent: Mar. 1, 2016

(54) SYSTEMS AND METHODS OF STACKING LC TANKS FOR WIDE TUNING RANGE AND HIGH VOLTAGE SWING

(71) Applicant: PEREGRINE SEMICONDUCTOR CORPORATION, San Diego, CA (US)

(72) Inventors: Chun-Cheng Wang, San Diego, CA (US); Jianhua Lu, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 13/931,675

(22) Filed: Jun. 28, 2013

(65) Prior Publication Data

US 2015/0002236 A1    Jan. 1, 2015

(51) Int. Cl.

| H03B 5/32 | (2006.01) |
|---|---|
| H03H 7/01 | (2006.01) |
| H03B 1/00 | (2006.01) |
| H03F 3/191 | (2006.01) |
| H01F 17/00 | (2006.01) |
| H03H 5/12 | (2006.01) |
| H03F 1/22 | (2006.01) |
| H03F 3/45 | (2006.01) |
| H03B 5/12 | (2006.01) |
| H03F 3/193 | (2006.01) |

(52) U.S. Cl.
CPC .......... *H03H 7/0115* (2013.01); *H01F 17/0006* (2013.01); *H03B 1/00* (2013.01); *H03B 5/1203* (2013.01); *H03B 5/124* (2013.01); *H03B 5/1228* (2013.01); *H03B 5/1268* (2013.01); *H03F 1/223* (2013.01); *H03F 3/191* (2013.01); *H03F 3/193* (2013.01); *H03F 3/4508* (2013.01); *H03H 5/12* (2013.01); *H03B 2200/0008* (2013.01); *H03F 2203/45394* (2013.01); *H03F 2203/45631* (2013.01); *H03F 2203/45638* (2013.01)

(58) Field of Classification Search
CPC .................................................. H03H 7/0115
USPC ............ 331/117 R, 177 V, 181, 167, 117 FE; 333/174
See application file for complete search history.

(56) References Cited

U.S. PATENT DOCUMENTS

| 6,084,486 A * | 7/2000 | Suzuki et al. ................. 333/174 |
|---|---|---|
| 2004/0041665 A1 * | 3/2004 | Hode et al. .................... 333/175 |
| 2011/0043271 A1 | 2/2011 | Ranta et al. |
| 2012/0286889 A1 * | 11/2012 | Park et al. ............... 331/117 FE |
| 2013/0154868 A1 * | 6/2013 | Kehrer et al. ................... 342/16 |
| 2013/0222075 A1 | 8/2013 | Reedy et al. |
| 2013/0241661 A1 * | 9/2013 | Chang et al. ................... 331/48 |

FOREIGN PATENT DOCUMENTS

WO    WO2009/108391    9/2009

* cited by examiner

*Primary Examiner* — Joseph Chang
(74) *Attorney, Agent, or Firm* — Jaquez Land Richman LLP; Martin J. Jaquez, Esq.; Alessandro Steinfl, Esq.

(57) ABSTRACT

A cascaded arrangement of resonant tanks capable of widening frequency selection and tuning within an RF circuit is presented. Moreover, usage of DTC allows for larger frequency tuning per tank as well as handling of higher voltage swings while maintaining high linearity across the tuning range.

32 Claims, 21 Drawing Sheets

SYSTEMS AND METHODS OF STACKING LC TANKS FOR WIDE TUNING RANGE AND HIGH VOLTAGE SWING

BACKGROUND

1. Field

The present teachings relate to resonant tanks as used in RF circuits. More particularly, the present teachings relate to methods and systems for widening the tuning range of such resonant tanks in the presence of signals with large voltage swings.

2. Description of Related Art

Resonant tanks, also known as parallel LC tanks, composed of an inductor (L) and a capacitor (C) in parallel are widely used to provide frequency selection and tuning of RF signals used in RF circuits using amplifiers and oscillators for example. Such circuits may be assembled on a printed circuit board or integrated within a die, such as for example an integrated circuit (IC). The performance of the parallel LC tank is known by its Q factor measured at a resonant frequency $\omega_0$ (angular frequency) such as a larger Q factor provides an increased performance of the tank in terms of both frequency selection and tuning. However, at resonant frequency, the parallel LC tank exhibits a finite resistance which degrades the performance of the tank. This resistance, which is in parallel to the LC tank, decreases as frequency decreases, providing a smaller load to a current feeding the LC tank and thus reducing the amplitude of the signal across the tank. Increasing the current feeding the LC tank can, to some degree, compensate for the decrease in signal amplitude but renders very wide tuning range of the LC tank more difficult.

As used in the present disclosure, the term "IC" can refer to an integrated circuit or monolithic integrated circuit composed of a set of electronic circuits on one small plate ("chip") of semiconductor material such as silicon. An IC can also be referred to as a "chip" or a "microchip". The set of electronic circuits within an IC are typically made of a very large number of transistors and other electronic components, which may need supply power (e.g. positive supply and negative supply) to operate.

Throughout the present disclosure, the terms "LC tank", "parallel LC tank", "resonant tank", parallel resonant tank" and "tank", are used interchangeably and refer to the same circuit comprising an inductor and a capacitor connected in parallel. The notion of an "ideal" tank and a "non-ideal" tank are described in later paragraphs of the present disclosure and need no further introduction to the skilled person.

SUMMARY

According to a first aspect of the present disclosure, a circuital arrangement is presented, the circuital arrangement comprising a plurality of tunable inductance-capacitance (LC) resonant tanks connected in series, the circuital arrangement exhibiting, in use, an impedance value at a resonant frequency of each tunable LC resonant tank of the plurality of tunable LC resonant tanks, the impedance value being configured to be larger than or equal to a desired impedance value and substantially equal to the impedance value of the each tunable LC resonant tank.

According to a second aspect of the present disclosure, a method for tuning an amplitude response of a radio frequency (RF) circuit at a frequency of operation is presented, the method comprising: providing the RF circuit; providing one or more different frequency ranges for the frequency of operation of the RF circuit; providing a plurality of series-connected tunable LC tanks; configuring the series-connected tunable LC tanks according to the provided different frequency ranges; operatively coupling the series-connected tunable LC tanks to the RF circuit; tuning the series-connected tunable LC tanks; and based on the tuning of the series-connected tunable LC tanks, tuning the amplitude response of the RF circuit at the desired frequency of operation.

According to a third aspect of the present disclosure, a method for providing a multiple band radio frequency (RF) circuit is presented, the method comprising: providing an RF circuit; providing N center frequencies corresponding to N bands of operation, wherein N is a number larger than one; providing a N series-connected tunable LC tanks; configuring the N series-connected tunable LC tanks according to the provided center frequencies wherein the N resonant frequencies of the N series-connected tunable LC tanks are in correspondence of the N center frequencies; operatively coupling the N series connected tunable LC tanks to the RF circuit; based on the coupling, providing a passband region to a signal corresponding to a band of operation; and based on the coupling, providing an attenuation region to a signal outside a band of operation.

According to a fourth aspect of the present disclosure, a method for providing a wider tuning range for a radio frequency (RF) circuit is presented, the method comprising: providing an RF circuit comprising an N series connected tunable LC tanks configured to affect an output signal of the RF circuit; configuring two or more tunable LC tanks of the N series connected tunable LC tanks; based on the configuring, overlapping passbands regions of the two or more tunable LC tanks; based on the overlapping, obtaining a wider passband region wherein an output voltage of the output signal is larger than a minimum desired voltage; and based on the obtaining, obtaining a wider tuning range for the RF circuit.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Figure 1A:
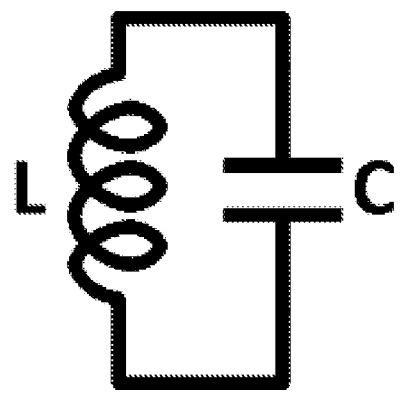
FIG. 1A shows an ideal resonant tank circuit, also known as an LC tank, comprising an inductor L in parallel with a capacitor C.
Figure 1B:
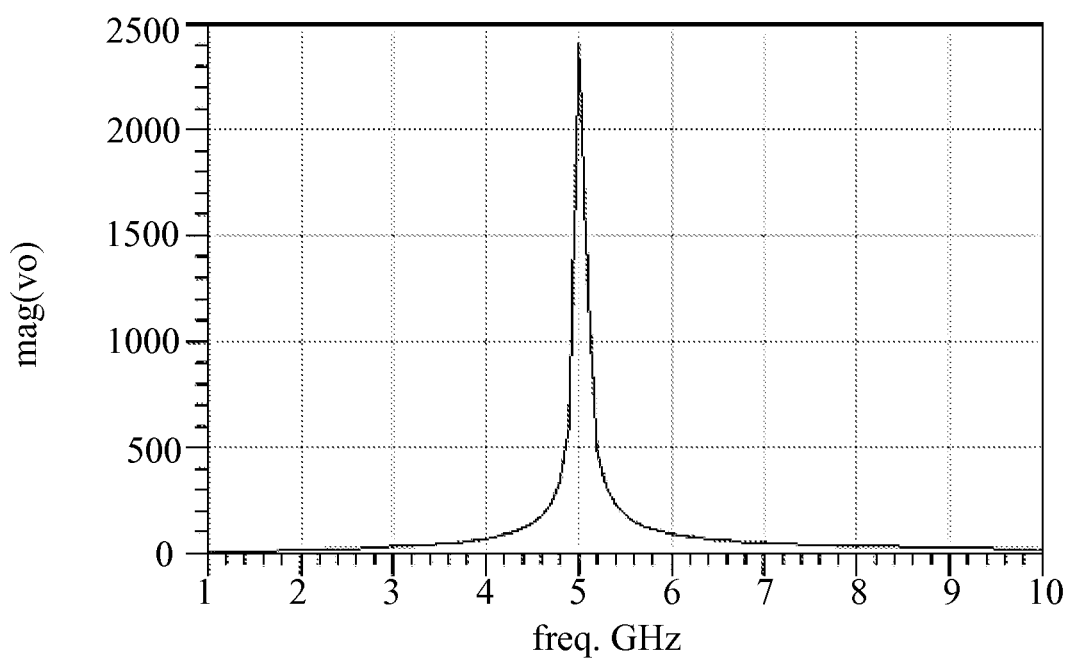
FIG. 1B shows an amplitude versus frequency response of the ideal resonant tank circuit of FIG. 1A.

Resonant tanks, e.g., an inductor and a capacitor in parallel, also known as parallel LC tanks, are widely used to provide frequency selection/tuning in the design of radio frequency (RF) circuitry. FIG. 1A shows a resonant tank which comprises an inductor L and a capacitor C connected in parallel. Such resonant tank, also known as an ideal LC tank due to its lack of resistive components, has an amplitude versus frequency response as represented in FIG. 1B. The amplitude response peaks at a frequency within a very narrow band wherein an input signal is passed (e.g. its amplitude is not highly attenuated). The angular frequency $\omega_0$ at which the amplitude reaches the peak is known as the resonant frequency of the LC tank and is a function of the inductor L and capacitor C, such as:

$$\omega_0 = \frac{1}{\sqrt{LC}}; \qquad (1)$$

$\omega_0$ being the angular frequency such as $\omega_0 = 2\pi f$

The amplitude versus frequency graph of FIG. 1B is obtained using L=1 nH and C=1 pF.

The response bandwidth (width of the frequency response around the peak amplitude wherein the signal is passed) and the peak amplitude of the response at the resonant frequency are dependent to a parameter called the Q-factor. As known by a person skilled in the art, a higher Q-factor will provide a narrower response bandwidth and a higher peak amplitude at the resonant frequency.

Figures 2A, 2B:
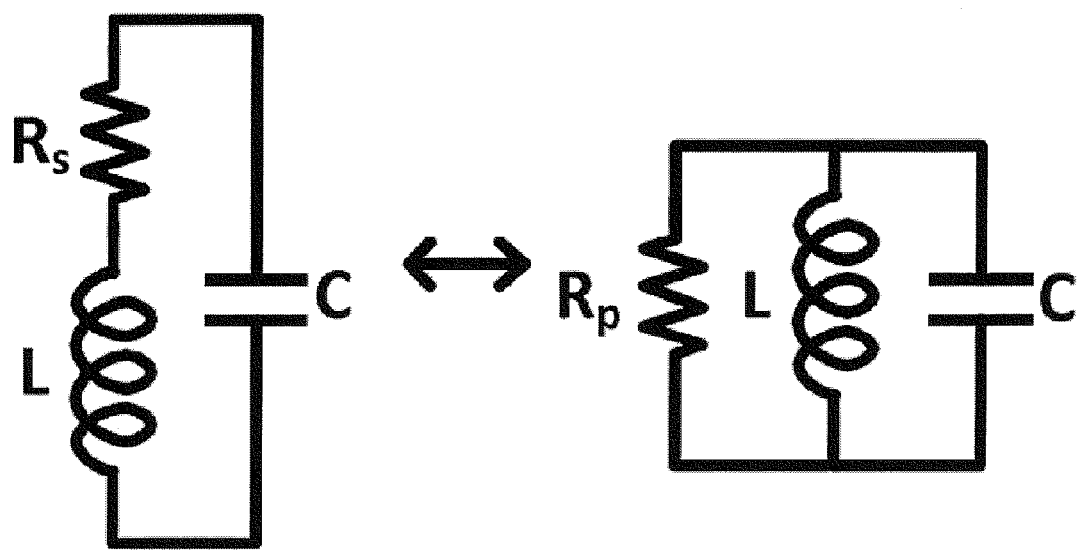
FIG. 2A shows a non-ideal resonant tank circuit with an inductor series resistance associated to the inductor of the resonant tank.
FIG. 2B shows an equivalent circuit to the circuit of FIG. 2A, wherein the series resistance is replaced with a parallel resistance to the LC tank.

However, in a real LC tank, the inductor L and capacitor C also exhibit some parasitic resistances which further affect the response of the LC tank. This resistive component is typically dominated by the inductor series resistance as shown in FIG. 2A, wherein resistor $R_s$ represents the inductor equivalent series resistance. FIG. 2B is an equivalent resonant circuit to the circuit of FIG. 2A, wherein the inductor series resistor $R_s$ is replaced by a parallel inductor $R_p$. The two circuits of FIGS. 2A and 2B have the same Q-factor if:

$$Q = \frac{\omega_0 L}{R_s} = \frac{R_p}{\omega_0 L} \qquad (2)$$

From equation (2) it follows:

$$R_p = \frac{(\omega_0 L)^2}{R_s} \qquad (3)$$

At resonance frequency, the impedance of the parallel LC tank is purely resistive with an equivalent resistance $R_p$, and thus the higher the $R_p$, the higher the peak amplitude of a signal across the parallel tank (assuming a constant current into the tank).

Figure 3A:
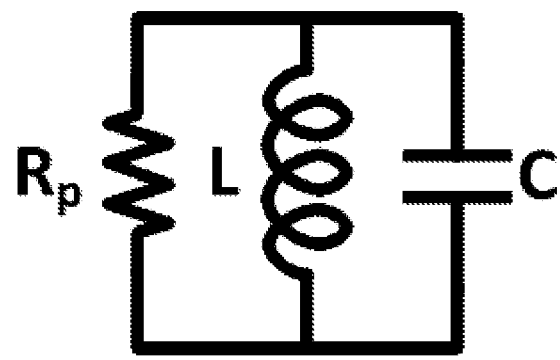
FIG. 3A shows a non-ideal resonant tank circuit.
Figure 3B:
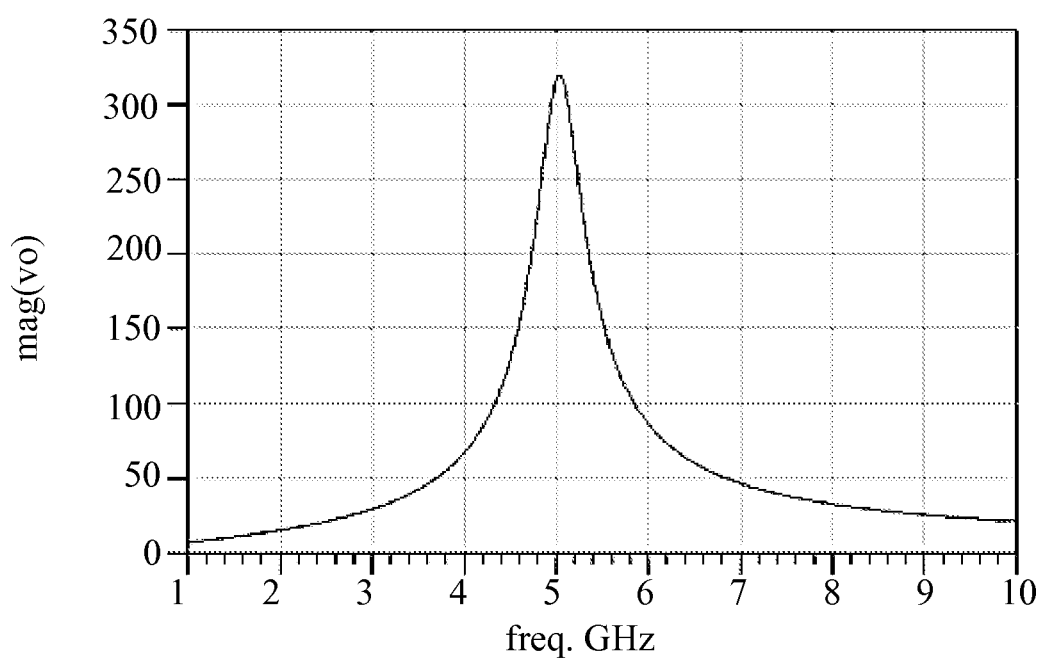
FIG. 3B shows an amplitude versus frequency response of the non-ideal resonant tank circuit of FIG. 3A.

FIG. 3A shows a non-ideal parallel LC tank which includes the equivalent parallel resistance $R_p$ as derived by equations (2) and (3). FIG. 3B shows the amplitude response of the non-ideal parallel tank of FIG. 3A. Contrasting the amplitude response of FIG. 3B to the amplitude response of FIG. 1B corresponding the ideal parallel RC tank (equivalent parallel resistance is infinite) of FIG. 1A, one can notice the widening of the response as well as the reduction of the peak amplitude response at the resonant frequency. As the parallel resistance $R_p$ decreases, the voltage swing across the LC tank also decreases.

The amplitude versus frequency graph of FIG. 3B is obtained using L=1 nH, C=1 pF, and $R_p$=314 Ohm.

From equation (2) one can also see that as the resonant frequency decreases, for example by varying (e.g. increasing)

the capacitance C of the parallel LC tank (e.g. per equation (1)), the equivalent parallel resistance $R_p$ of the tank also decreases. Therefore, in order to maintain a given voltage swing across the LC tank as the frequency varies (e.g. decreases), one needs to also vary (e.g. increase) an equivalent current being fed to the tank. For example one can see from equation (3), if the resonant frequency is reduced to half (50%) of its original value, then the equivalent parallel resistance is reduced to one quarter (25%) of its original value. In order to compensate for this decrease in resistance value, one needs to increase the current fed to the LC tank (e.g. four times higher to maintain the same voltage swing). Increasing the current by a factor of four will invariably require active devices (e.g. transistors) with larger size to support the larger current. In turn, larger device size will cause an increase in a parasitic junction capacitance of the device which can affect the tuning range of the device (e.g. smaller tuning range). Larger device size and current will also increase power consumption.

From above it becomes apparent that frequency tuning of an LC tank circuit has some practical limitations beyond which circuit performance, size and power consumption can be affected. These shortcomings were the underlying motivation to the disclosed embodiments.

Figure 4:
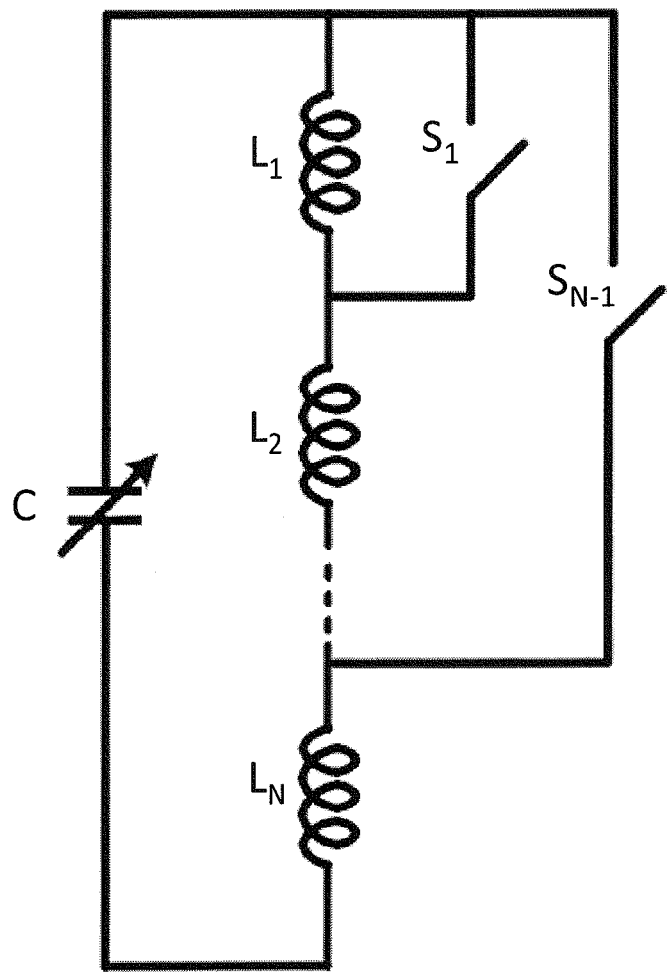
FIG. 4 shows a prior art example implementation of a variable frequency resonant circuit.

FIG. 4 shows a prior art implementation of an extended range tunable LC tank, where in the tuning range is selected via a combination of parallel switches to the various inductors of the tank. In particular, switches ($S_n$) select the value of the inductance in parallel to the variable capacitor (C). For example, if switch $S_1$ is closed and all other switches are open, then the value of the inductance in parallel to the variable capacitor (C) is the sum of the inductance values corresponding to the series connected inductors $L_2$ through $L_N$. On the other hand, if switch $S_{N-1}$ is closed, then irrelevant of the state of the other switches, the value of the inductance in parallel to the variable capacitor (C) is the value of the inductance of the inductor $L_N$. In the configuration of the tunable LC tank of FIG. 4, the tuning range is set by the combination of switches ($S_n$) which select the inductor across the LC tank, ranging from $L_{min}=L_N$ to $L_{max}=SUM(L_1, L_2, \ldots, L_N)$. In turn, for a given selected inductor, the resonant frequency of the tank is varied via changes in the capacitance value of the variable capacitor (C). It should be noted that in the case of the arrangement of FIG. 4, for a given combination of switches ($S_n$), the resulting LC tank is a conventional non-ideal LC tank as depicted by FIG. 2B.

Although the arrangement of FIG. 4 allows one to obtain a wider frequency tuning range by virtue of the selectable ranges (e.g. inductors), an associated drawback of the implementation of FIG. 4 is the finite resistance of the switches $S_n$. Such resistance, corresponding to the close state of a switch, becomes in series to the selected inductor by the switch and thus increases by the same amount the equivalent series resistance of the inductor as depicted in FIG. 2A. This in turn affects the equivalent parallel resistance of the LC tank per equations (2) and (3), with a net effect of decreasing the value of $R_p$. In turn and as seen in the prior paragraphs, the decrease of the parallel resistance decreases selectivity of the circuits (e.g. wider response) and decreases the voltage swing across the tank for a given current input.

Figure 5A:
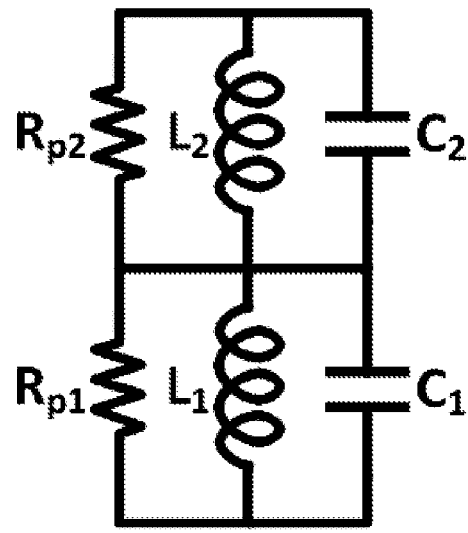
FIG. 5A shows an example embodiment according to the present disclosure of a two-series LC tanks.

FIG. 5A shows an arrangement according to an embodiment of the present disclosure comprising two series connected LC tanks, wherein each LC tank is a non-ideal LC tank with a given resonant frequency. A first tank of FIG. 5A comprises ($L_1, C_1, R_{p1}$) and a second tank of FIG. 5A comprises ($L_2, C_2, R_{p2}$).

Figure 5B:
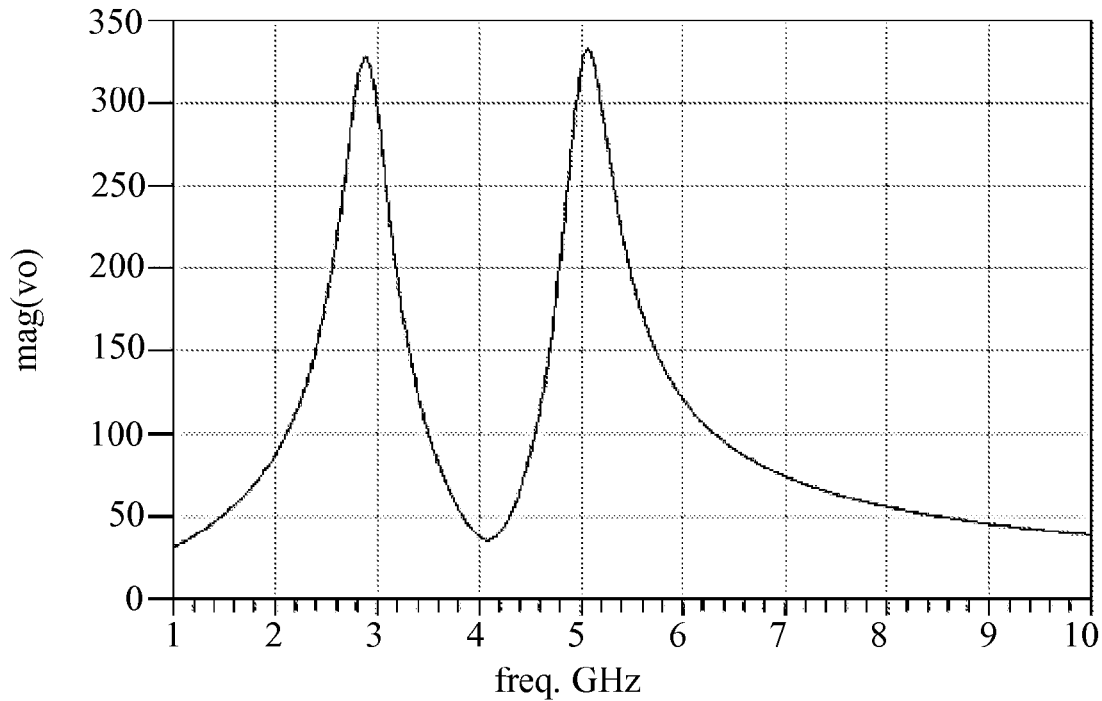
FIG. 5B shows an amplitude versus frequency response of the two-series LC tank of FIG. 5A.

FIG. 5B shows the amplitude versus frequency response of the arrangement of FIG. 5A. Looking at the graph in FIG. 5B, one can notice the two distinct peaks at different frequencies, wherein each peak corresponds to one of the two non-ideal LC tanks. The amplitude versus frequency graph of FIG. 5B is obtained using $L_1=1$ nH, $C_1=1$ pF, $R_{p1}=314$ Ohm, $L_2=3$ nH, $C_2=1$ pF and $R_{p2}=942$ Ohm.

The arrangement of FIG. 5A used in an RF circuit would present a dual band frequency response, with a lower band at around 2.8 GHz and a higher band at around 5.2 GHz. As the frequency spans the x-axis of the graph of FIG. 5B, the further from a resonant frequency, the more attenuation is provided to a corresponding signal due to a large degradation of the combined equivalent parallel resistance of the arrangement, which can be approximated to the series combination of the equivalent parallel resistance of each of the tanks. As the frequency approaches a resonant frequency, corresponding to a resonant tank in the arrangement, the combined equivalent parallel resistance increases. This increase is mainly due to the increase of the equivalent parallel resistance of one resonant tank. This in turn causes a larger voltage swing across the arrangement until a peak at a resonant frequency is observed.

By contrasting the graph in FIG. 5B to the graph in FIG. 3B, it is clear that the peak amplitude and response bandwidth centered around 5.1 GHz corresponds to the contribution of the non-ideal LC tank composed of (L1, C1, Rp1), as latter components have the same value as the (L, C, Rp) components used in FIG. 3A. By contrasting the same graphs, the skilled person will also note that the impact of the second non-ideal LC tank of the arrangement presented in FIG. 5A on the performance of the first non-ideal LC tank is negligible. Same parallel can be made with respect to the influence of the first non-ideal LC tank of FIG. 5A over the performance of the second non-ideal LC tank. As such, the skilled person will notice that the two non-ideal LC tanks of FIG. 5A are not affected by each other's presence.

Such configuration presented in FIG. 5A and resulting response per FIG. 5B can be extended to a plurality (3, 4, 5, . . . , N) of stacked non-ideal LC tanks in a series arrangement. Although throughout this disclosure the case of two stacked LC tanks is illustrated, such illustrative description should only be considered as exemplary embodiments and not limiting the scope of the concept as disclosed herein.

Figure 6A:
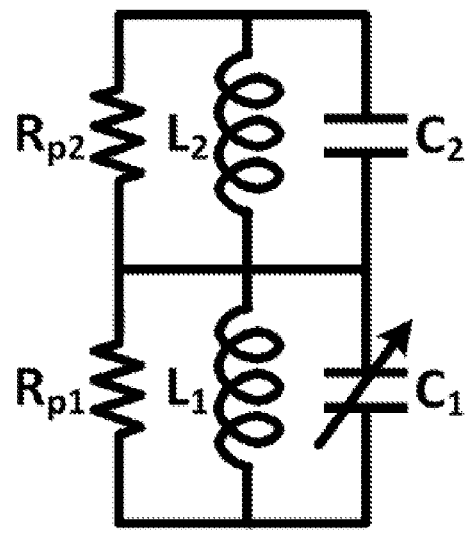
FIG. 6A shows an example embodiment according to the present disclosure of a two-series LC tank with a one adjustable capacitor in the first tank and one fixed capacitor in the second tank.

FIG. 6A shows an arrangement according to an embodiment of the present disclosure of a stacked arrangement of non-ideal LC tanks connected serially wherein one of the tanks is tunable. In the particular case of the arrangement presented in FIG. 6A, there are two stacked non-ideal LC tanks, ($L_1, C_1, R_{p2}$) and ($L_2, C_2, R_{p2}$), wherein $C_1$ is a variable capacitor and all other components have fixed values. Tunability is obtained via the variable capacitor ($C_1$). The arrangement presented in FIG. 6A is the same arrangement as presented in FIG. 5A with the exception of the capacitor $C_1$ which is variable in the embodiment of FIG. 6A.

Figure 6B:
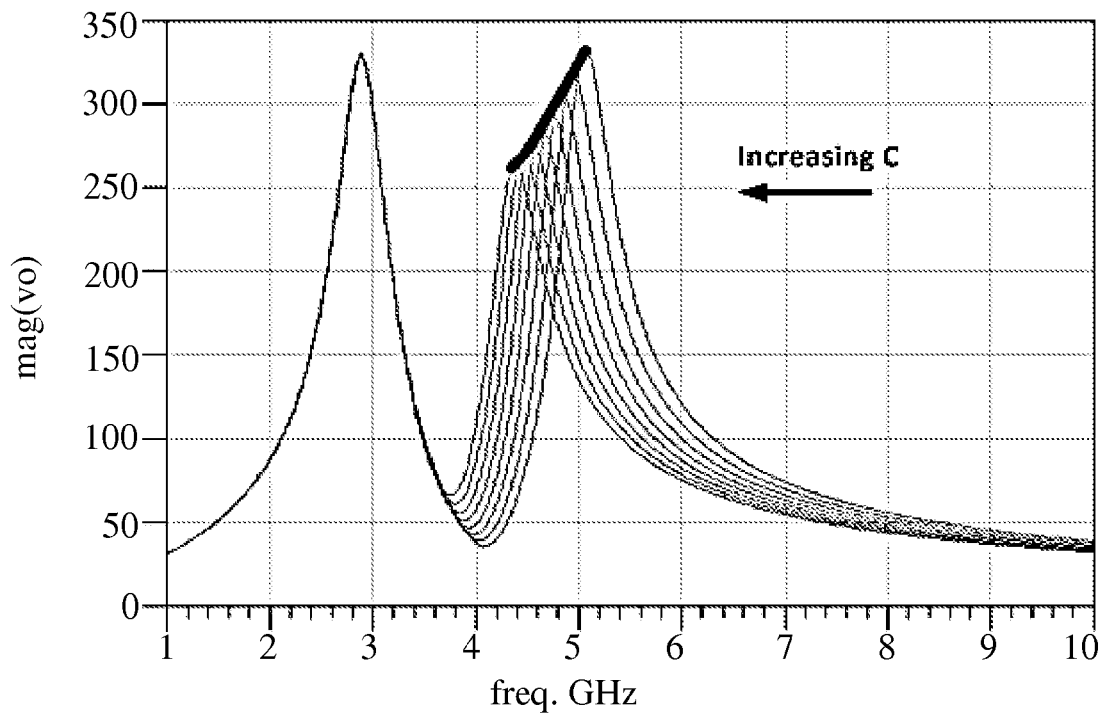
FIG. 6B shows an amplitude versus frequency response of the two-series LC tank of FIG. 6A for varying values of the adjustable capacitor.

FIG. 6B shows the amplitude versus frequency response of the arrangement presented in FIG. 6A for varying values of the variable capacitor ($C_1$). As the capacitance value of the variable capacitor ($C_1$) is increased, the resonant frequency of the first non-ideal LC tank ($L_1, C_1, R_{p1}$) decreases (as per (1)) and the peak amplitude decreases as the tank equivalent parallel resistance degrades (e.g. resistance decreases per equation (3)). The graph of FIG. 6B further indicates that as ($C_1$) value varies, the contribution to the overall response of the arrangement of FIG. 6A of the second non-ideal LC tank ($L_2, C_2, R_{p2}$) remains constant, and thus influence of the first tunable non-ideal LC tank over the second non-ideal LC tank of FIG. 6A is constant over the tuning range of the first tank.

Looking at the graph of FIG. 6B one may notice that as the capacitor is varied to tune the first non-ideal LC tank to a different (resonant) frequency, the amplitude response of the circuit around the resonant frequency of the first non-ideal LC tank decreases. In the particular case of the FIG. 6B, this amplitude is at around 370 units at 5.2 GHz and goes down to around 265 units at 4.3 GHz. As noted in prior paragraphs and described by the equations (1) through (3), this reduction in amplitude is due to a decrease of the equivalent parallel resistance of the corresponding non-ideal LC tank. This decrease in amplitude of less than 30% over a tuning range of around 1 GHz may be compensated, if desired, by a corresponding increase in a bias current fed to the LC arrangement by a corresponding circuit. Tuning range may be bounded by the output current capability of such circuit which in turn would dictate a minimum value of the equivalent parallel resistance of the non-ideal LC tank. Furthermore this decrease in resonant frequency amplitude with respect to an increasing capacitance value of the variable capacitor C1 is substantially linear as depicted in FIG. 6B. Such a linear response is also advantageous if current compensation is desired, as a linear response requires a simpler compensation (e.g. current compensation) circuit.

Figure 7A:
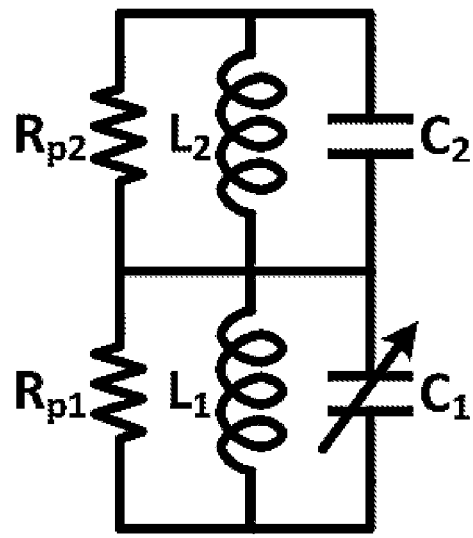
FIGS. 7A and 7B shows the same as in FIGS. 6A and 6B but with a different value fixed capacitor in the second LC tank.
Figure 7B:
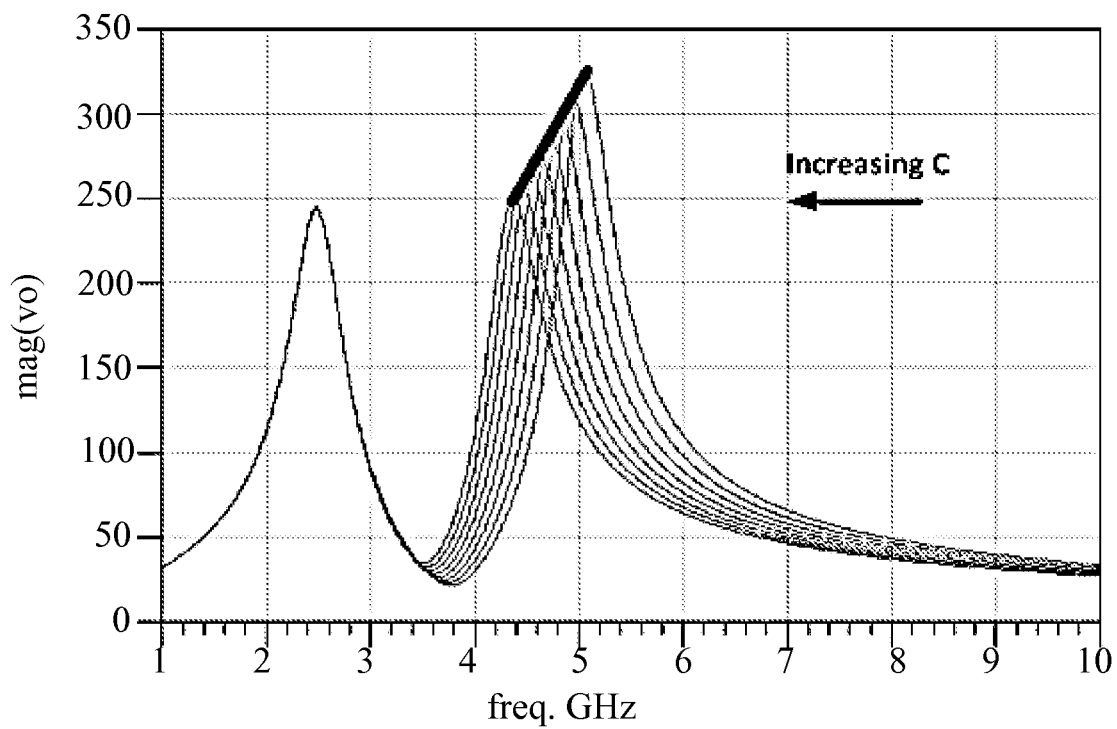
Figure 8A:
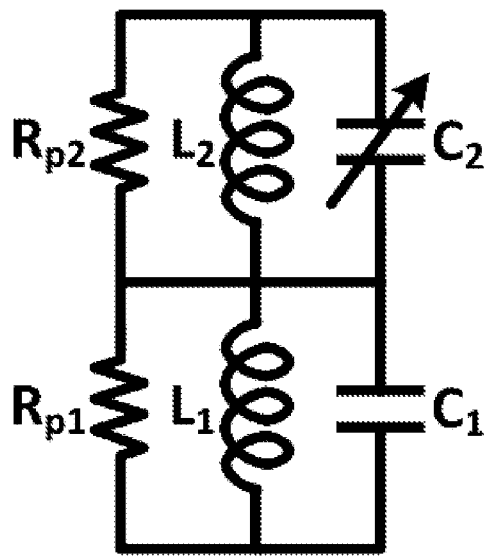
FIG. 8A shows an example embodiment according to the present disclosure of a two-series LC tank with a one adjustable capacitor in the second tank and one fixed capacitor in the first tank.
Figure 8B:
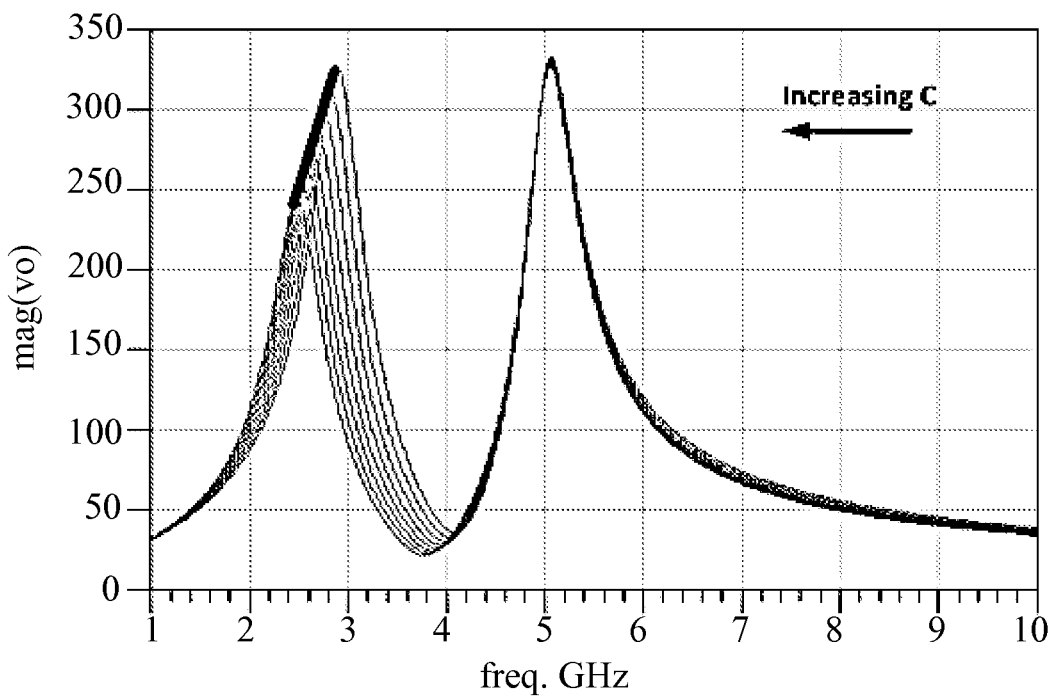
FIG. 8B shows an amplitude versus frequency response of the two-series LC tank of FIG. 8A for varying values of the adjustable capacitor.
Figure 9A:
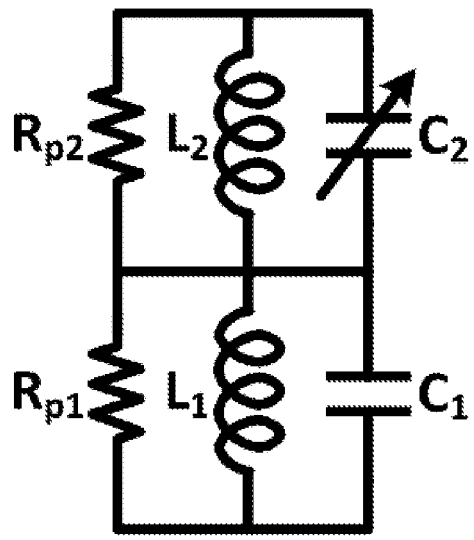
FIGS. 9A and 9B show the same as in FIGS. 8A and 8B but with a different value fixed capacitor in the first LC tank.
Figure 9B:
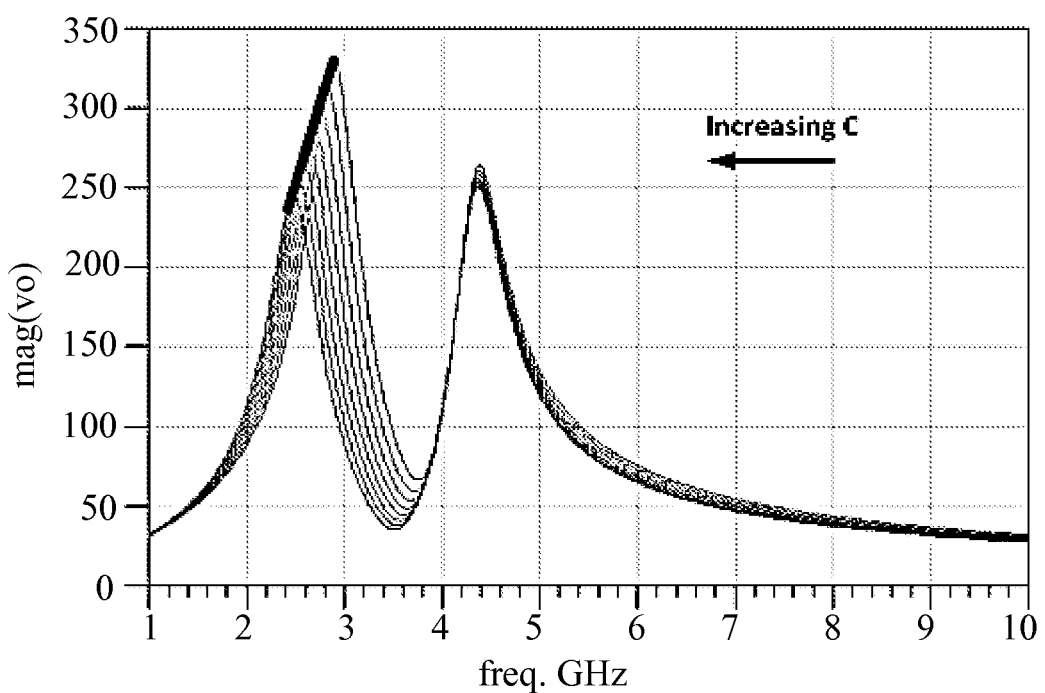

FIG. 7A shows the dual-series LC tank of FIG. 6A wherein the value of the fixed capacitor ($C_2$) corresponding to the lower band non-ideal LC tank is increased. As expected per prior paragraphs and depicted in the graph of FIG. 7B, the associated resonant frequency of the lower band tank has shifted to a lower frequency when compared to the embodiment of FIG. 6A. This shift in resonance of the lower band tank, from around 2.8 GHz in FIG. 6B to around 2.5 GHz in FIG. 7B has not substantially affected the response and tunability with respect to a varying value of ($C_1$) of the higher band tank, which remains substantially the same as in FIG. 6B.

Although not depicted in FIG. 7A, in actual implementation, the non-idealities of one tank may affect the impedance of the other. If the band of interest is the higher band (e.g. having signal operating in the frequency band of the higher band), one can shift the lower band by tuning $C_2$ such that the tank ($L_2$, $C_2$, $R_{p2}$) provides negligible impedance at the resonance of ($L_1$, $C_1$, $R_{p1}$) such as impedance of the arrangement at the resonance of ($L_1$, $C_1$, $R_{p1}$) is largely dominated by or substantially equal to the impedance of ($L_1$, $C_1$, $R_{p1}$). Tuning of C2 can be done, for example, by using the embodiment of FIG. 10A (later described) wherein both capacitors of the series LC tank are variable.

FIGS. 8A, 8B, 9A and 9B show similar concepts to the embodiments of FIGS. 6A, 6B, 7A and 7B, but with respect to a varying ($C_2$) capacitor to tune the lower band tank. As per the corresponding figures one can appreciate the similar results obtained in regard to the tunability and influence to the neighboring LC tank as obtained in the case for the higher band tuning.

Figure 10A:
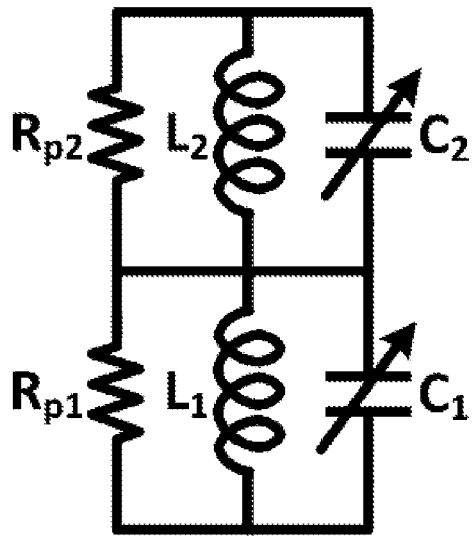
FIG. 10A shows an example embodiment according to the present disclosure of a two-series LC tank with a one adjustable capacitor in the first tank and one adjustable capacitor in the second tank.

FIG. 10A shows an embodiment according to the present disclosure of a dual-series LC tank wherein both the higher and the lower bands are tunable via variable capacitors (C1) and (C2) respectively. As previously noted the usage of two serially coupled non-ideal LC tanks should be considered as an exemplary embodiment and not limiting the scope of the disclosure, as higher number of serially connected non-ideal LC tanks is also possible. It should also be noted that the variable capacitors (C1) and (C2) may be any type of variable capacitor, such as a mechanically controlled continuously variable capacitor or a digitally controlled stepwise variable capacitor. In some embodiments according to the present disclosure, the variable capacitor may be a digitally tunable capacitor (DTC). In some embodiments the DTC may be fabricated using silicon on insulator (SOI) or silicon on sapphire (SOS) technologies which the skilled person is well aware of. Such fabrication technologies can provide digital tunable capacitors with higher tuning ratios (e.g. 3:1 Cmax/Cmin), less parasitic capacitance and handle higher voltage swings while maintaining higher linearity across the tuning range as compared to, for example, a conventional CMOS fabrication process. SOI and SOS processes allow for stacking several transistors (e.g. used to create a DTC or an amplifier device) in order to allow higher voltage swings to be divided evenly across the stack transistors, improving the overall reliability and lifetime of the transistors. Details regarding digitally tunable capacitors are described, for example, in PCT publication number WO2009/108391 entitled "Method and Apparatus for use in Digitally Tuning a Capacitor in an Integrated Circuit Device", published on Sep. 3, 2009 and which is incorporated by reference herein in its entirety.

In the embodiment of FIG. 10A, a higher band frequency tuning may be performed using the variable capacitor ($C_1$) and a lower band frequency tuning may be performed using the variable capacitor ($C_2$). In an embodiment according to FIG. 10A where more than two tunable non-ideal LC tanks are serially connected, each tank is provided with a variable capacitor for the tuning. As explained in prior paragraphs, tuning range for each of the tanks is mainly dictated by any limitation in current output of a corresponding (biasing) circuit which in turn dictates a minimum value of an equivalent parallel resistance of each of the non-ideal LC tanks (e.g. such as to maintain a minimum output voltage swing). The skilled person will know that only at resonant frequency the equivalent LC tank impedance is purely resistive and thus by virtue of the different frequency ranges of each of the LC tanks, there could not be a case where the arrangement disclosed in FIG. 10A would present more than one LC tank equivalent parallel resistance to a current providing circuit. Thus the frequency tuning range of each non-ideal LC tank of FIG. 10A with respect to the output capability of a corresponding current providing circuit is mainly dependent on the associated equivalent parallel resistance.

Figure 10B:
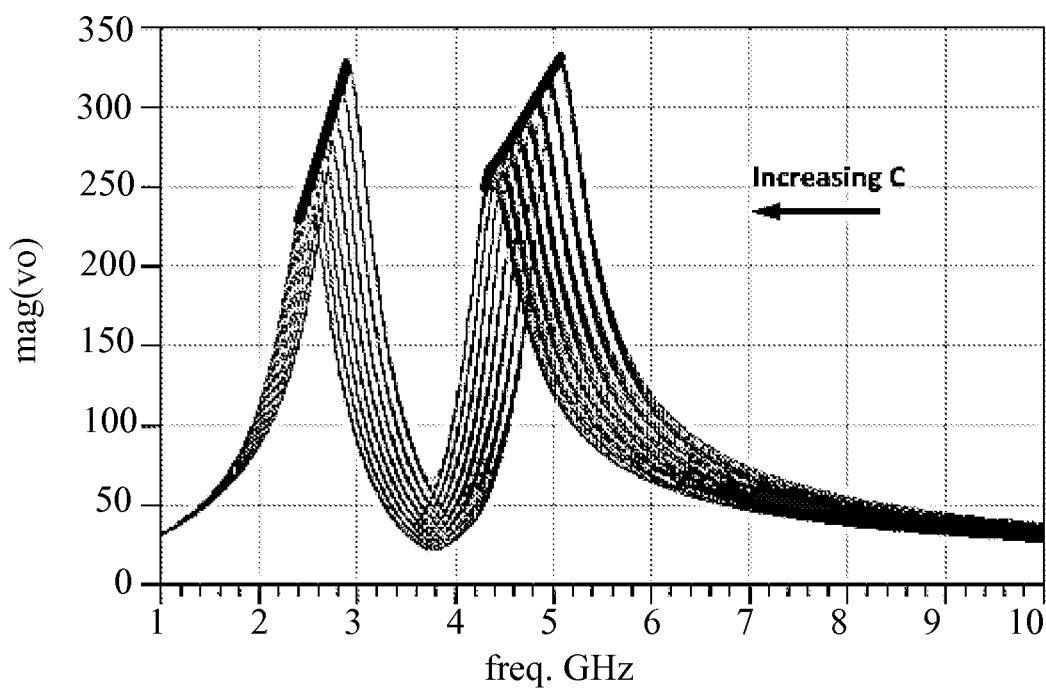
FIG. 10B shows an amplitude versus frequency response of the two-series LC tank of FIG. 10A for varying values of both adjustable capacitors.

This apparent independence of tuning one tank with respect to other tanks in the arrangement is also seen in the FIG. 10B, which depicts amplitude versus frequency response of the arrangement of FIG. 10A for varying values of tuning capacitors of each tank. The graph in FIG. 10B was obtained by using the same inductors ($L_1$) and ($L_2$) and the same variable capacitors ($C_1$) and ($C_2$) as used in FIGS. 6A and 8A. By contrasting the graph of FIG. 10B to the graph of FIG. 6B, the skilled person will notice that the higher band tunable tank ($L_1$, $C_1$, $R_{p1}$) of FIG. 10A has kept the same tuning range and peak response as for the higher band tunable tank ($L_1$, $C_1$, $R_{p1}$) of FIG. 6A despite the tunable band versus fixed band nature of the corresponding lower band tanks. Same comment may be made for the lower band tunable tank ($L_2$, $C_2$, $R_{p2}$) of FIG. 10A with respect to the lower band tunable tank ($L_1$, $C_1$, $R_{p1}$) of FIG. 8A.

So far the various tanks of the presented embodiments had components which in combination generated distinct frequency bands, wherein there existed high attenuation regions in-between the tunable passband regions of the various tanks corresponding to regions of degradation with respect to an equivalent parallel resistance (e.g. value of equivalent parallel resistance becomes too low) of the tanks (e.g. series combination of the various equivalent parallel resistances). Such embodiments may be used in systems where the frequency bands of interest are further apart from each other than the desired frequency tuning ranges of the bands. In some embodiments however there may be a need to further approach the various passbands, and thus creating an extended frequency tuning range wherein the passbands of the various tuning tanks appear to merge.

Figure 11A:
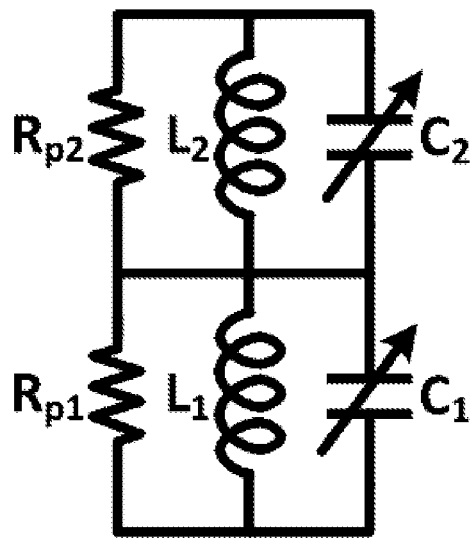
FIGS. 11A and 11B show the same as in FIGS. 10A and 10B but with the adjustable capacitor in the second LC tank having different range of values.
Figure 11B:
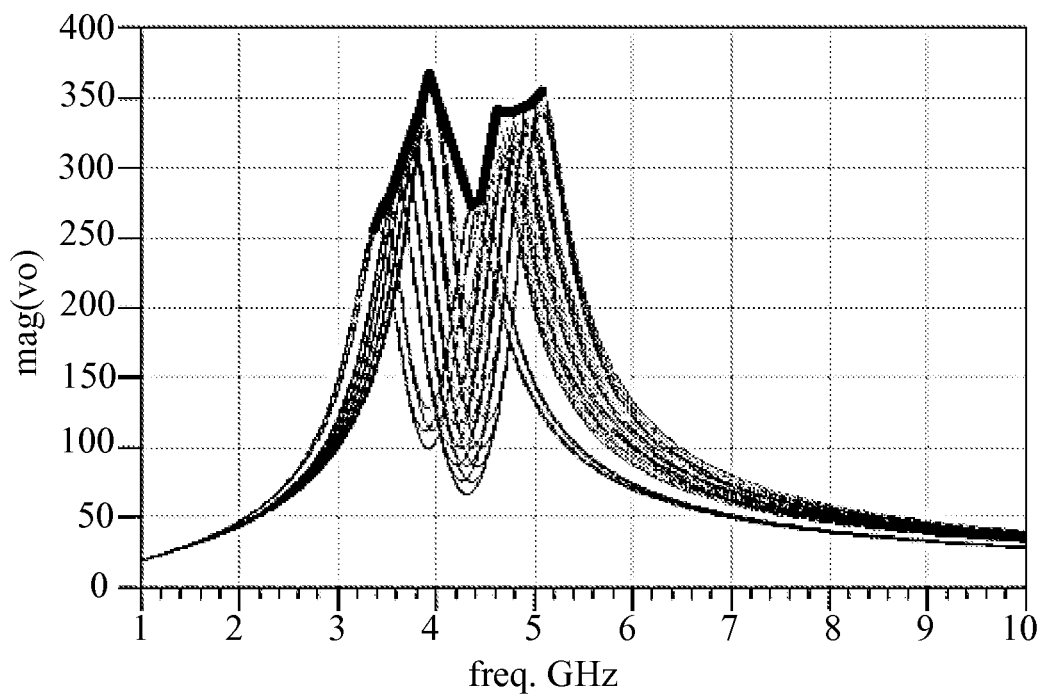

According to an embodiment of the current disclosure, a wideband continuous frequency tuning arrangement is presented in FIG. 11A. The arrangement presented in FIG. 11A is similar to the arrangement of FIG. 10A with the exception of the component values of the lower band non-ideal LC tank $(L_2, C_2, R_{p2})$. Latter values are chosen to move the lower band passband to close proximity of the higher band passband such as to create a wider continuous passband (e.g. overlapping passbands) as depicted in FIG. 11B. The relative vicinity of the resonant tanks thus created reduces the degradation of the combined equivalent parallel resistance over a wider frequency range, thus keeping a corresponding signal attenuation within an operable range (e.g. keeping a corresponding signal amplitude swing above a desired minimum value) over a wider frequency range as well. As a consequence, by varying the variable capacitors $(C_1)$ and $(C_2)$, a wider frequency tuning range is obtained which is wider than any of the individual continuous ranges provided by the prior embodiments of this disclosure.

Figure 11C:
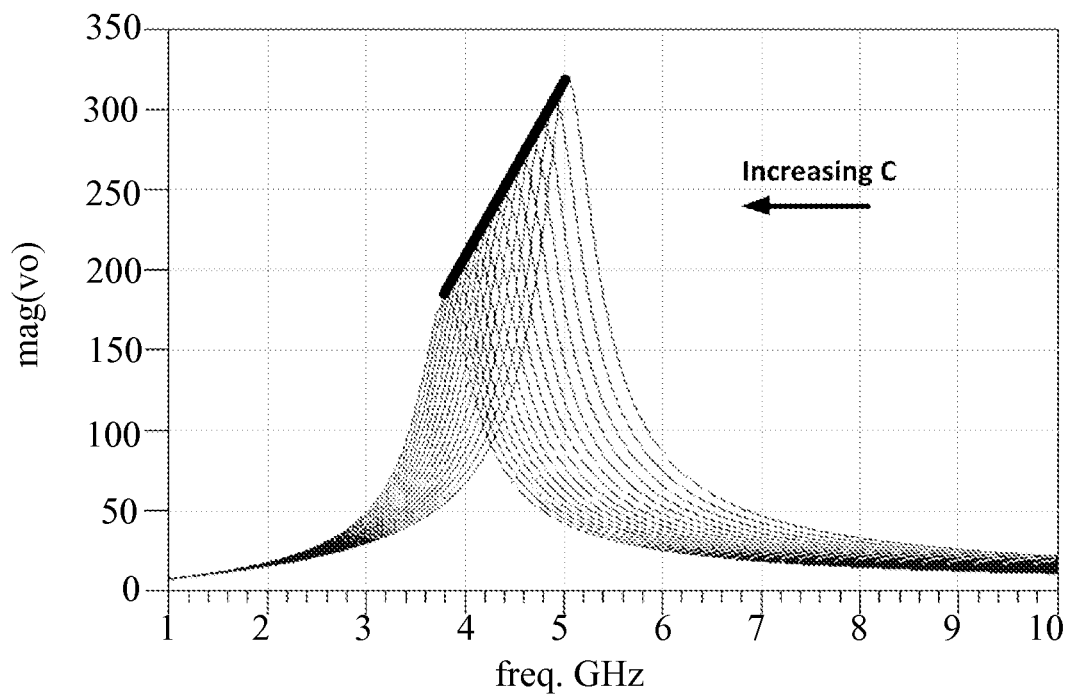

In the particular case of the graph of FIG. 11B, a signal swing with an amplitude larger than 260 units (over 70% of the peak amplitude, so attenuation below 30%) can be obtained at a frequency band ranging from approximately 3.4 GHz to 5.4 GHz, which represents a 2 GHz range. This is in contrast to the approximate 1 GHz range provided by the tunable tanks of the prior embodiments for the same attenuation range (e.g. below 30%). FIG. 11C shows the frequency response of a single tank comprising the higher band components $(L_1, C_1, R_{p1})$ of the stacked tank of FIG. 11A for a varying tuning range of [3.7 GHz, 5.0 GHz] within which a signal attenuation of over 66% is observed at a frequency of 3.7 GHz and a maximum 30% signal attenuation is observed within a 1.1 GHz band. The skilled person will appreciate the advantage in frequency tuning range while maintaining a minimum desired signal amplitude provided by the embodiment of FIG. 11A over the embodiment corresponding to FIG. 11C.

Figure 12:
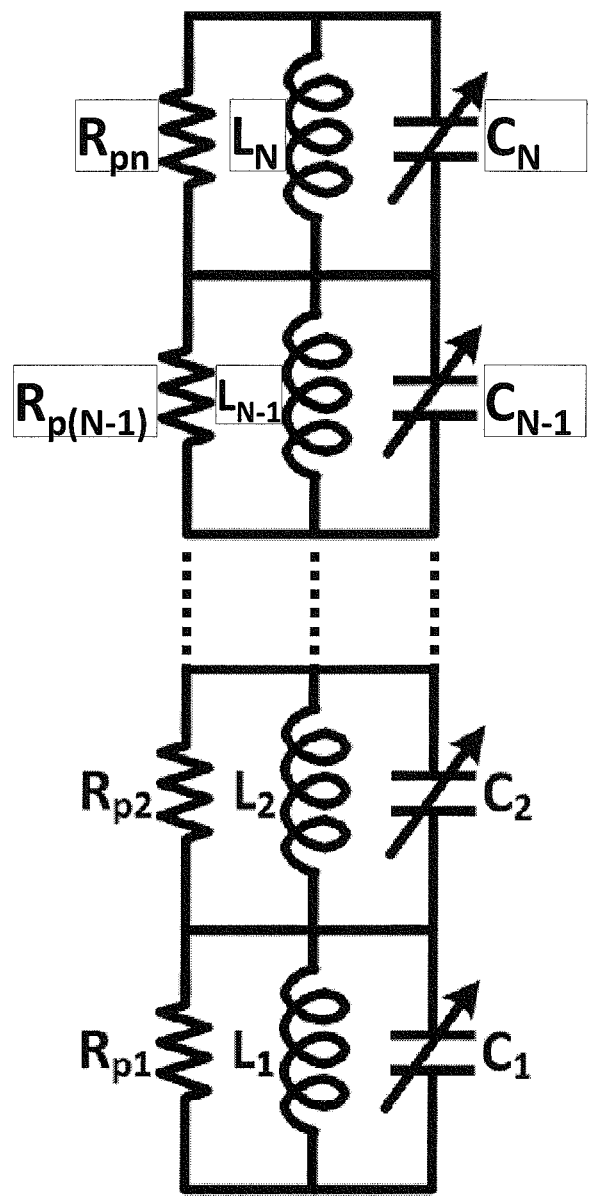
FIG. 12 shows an exemplary embodiment according to the present disclosure of N series connected LC tanks, wherein tuning is provided via variable capacitors.

Based on the prior discussion and methods presented within the present disclosure, the skilled person will now understand how serially stacking several non-ideal tanks as per the embodiment depicted in FIG. 12, and judiciously selecting the corresponding $(L_n, C_n, R_{pn})$ component values such as any two neighboring frequency bands (e.g. passbands) are sufficiently close, wideband continuous frequency coverage may be achieved. Continuous frequency tuning range of well over 2 GHz may be obtained via the N-series LC tank of FIG. 12.

In some embodiments according to the present disclosure several distinct wideband tuning ranges can be created by using the methods provided in the prior paragraphs. For example and referring back to FIGS. 11A and 11B, one may create an additional wideband continuous frequency coverage in the 7-9 GHz frequency range by serially adding two more LC tanks to the arrangement of FIG. 11A, wherein the combination of the two additional tanks creates the desired frequency coverage, distinct from the coverage provided by the original tanks.

Although throughout this disclosure the tuning element of the tanks has been the variable capacitor of the tank, in some embodiments according to the present disclosure, the tuning element can be chosen to be the inductor in the tank by making the inductor variable, as the same equations (1) through (3) apply equally to a variable inductor and a variable capacitor. Such embodiments can be used to create the same wideband continuous frequency coverage as described in the prior paragraphs. Similar to the case where the variable capacitor is used as tuning element of the tank, the variable inductor may also be any type of variable inductor, such as a mechanically controlled continuously variable inductor or a digitally controlled stepwise variable inductor. In some embodiments according to the present disclosure, the variable inductor may be a digitally tunable inductor (DTL). Details regarding digitally tunable inductors are described, for example, in U.S. patent application Ser. No. 13/595,893 entitled "Method and Apparatus for Use in Tuning Reactance in an Integrated Circuit Device", filed on Aug. 27, 2012, and which is incorporated by reference herein in its entirety.

Figure 13:
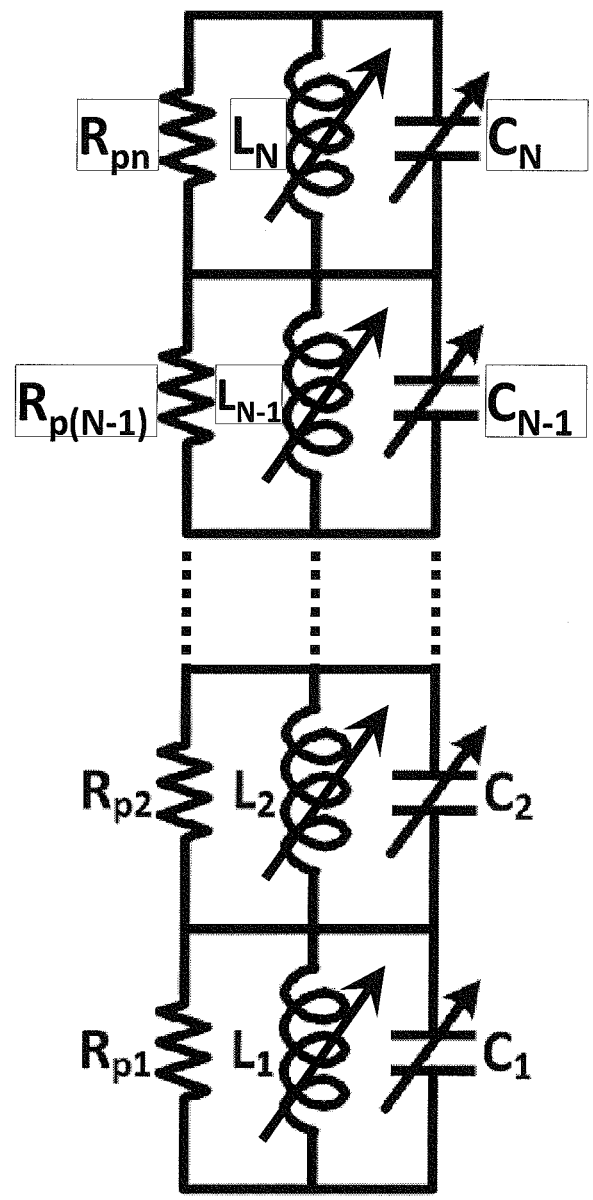
FIG. 13 shows an exemplary embodiment according to the present disclosure of N series connected LC tanks, wherein tuning is provided via variable inductors and variable capacitors.

According to a further embodiment of the present disclosure, a combination of both variable inductors and variable capacitors may be used in the various tanks of the arrangement as depicted in FIG. 13. Such a configuration provides the same tuning capability as the configurations presented in the prior paragraphs with the added benefit of further fine tuning each of the tanks to compensate for variation due to aging and/or temperature drift of the components, or to calibrate tanks across a production line.

Figure 14:
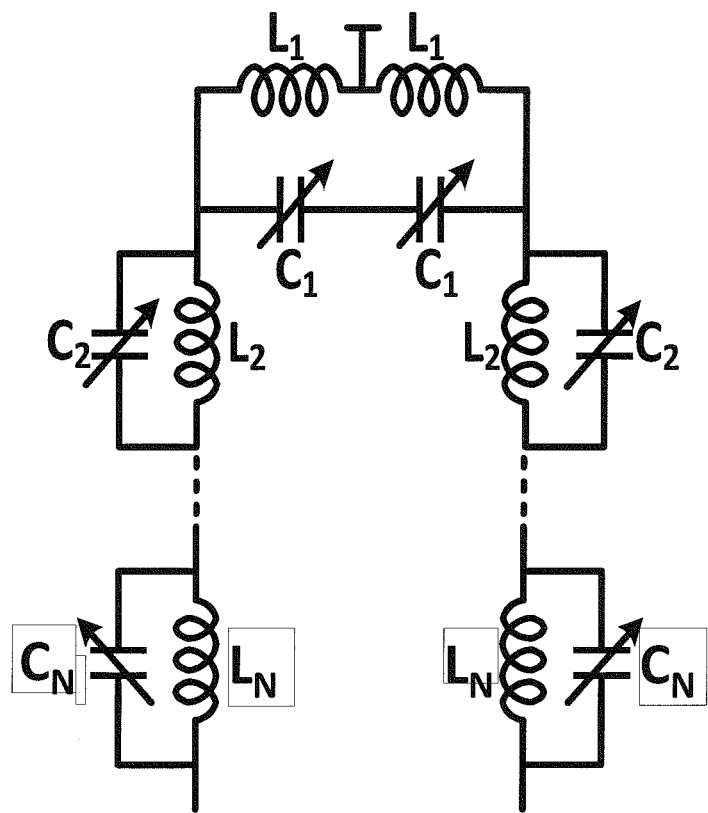
FIG. 14 shows an exemplary embodiment according to the present disclosure of a differential implementation of the embodiment of FIG. 12

Although the exemplary embodiments so far presented disclose single ended arrangements of series connected LC tanks, in other embodiments according to the present disclosure, differential arrangements of series connected LC tanks may be used with similar performance characteristics as shown in the various representative graphs of the present disclosure. For each single ended arrangement shown in the various figures (e.g. FIGS. 5A-11A, 12 and 13), the skilled person will know of a corresponding differential arrangement for which similar response graphs may be obtained (e.g. FIGS. 5B-11B). FIG. 14 is an exemplary differential arrangement according to one embodiment of the present disclosure.

In the differential embodiment depicted by FIG. 14, two parallel N series connected LC tanks with same nominal values $((L_1, C_1), (L_2, C_2), \ldots, (L_n, C_n))$ are provided. Each of the N series tank used in the differential embodiment of FIG. 14 is equivalent to the N series tank of the embodiment of FIG. 12. Attention is now brought to the connection of each of the two upper most parallel $(L_1, C_1)$ tanks, wherein each pair $(L_1, C_1)$ does not form a physical parallel connection. The skilled person will know that this physical parallel connection is not required in the differential embodiment of FIG. 14, since the center point of the two inductors L1 is effectively an AC ground (e.g. constant voltage) when the circuit of FIG. 14 operates in a differential mode, that is when two signals of equal magnitude and opposite phase are provided to each of the input terminals (e.g. at $(L_N, C_N)$ of the circuit. Same analogy can be made with the center point of the two capacitors $C_1$ which also rest at a same AC ground level. As such, the differential implementation of FIG. 14 can take advantage of the presence of said AC ground by physically combining the two inductors $(L_1)$ and/or the two capacitors $(C_1)$ to larger components with the net result of reducing physical size and layout area.

Figure 20:
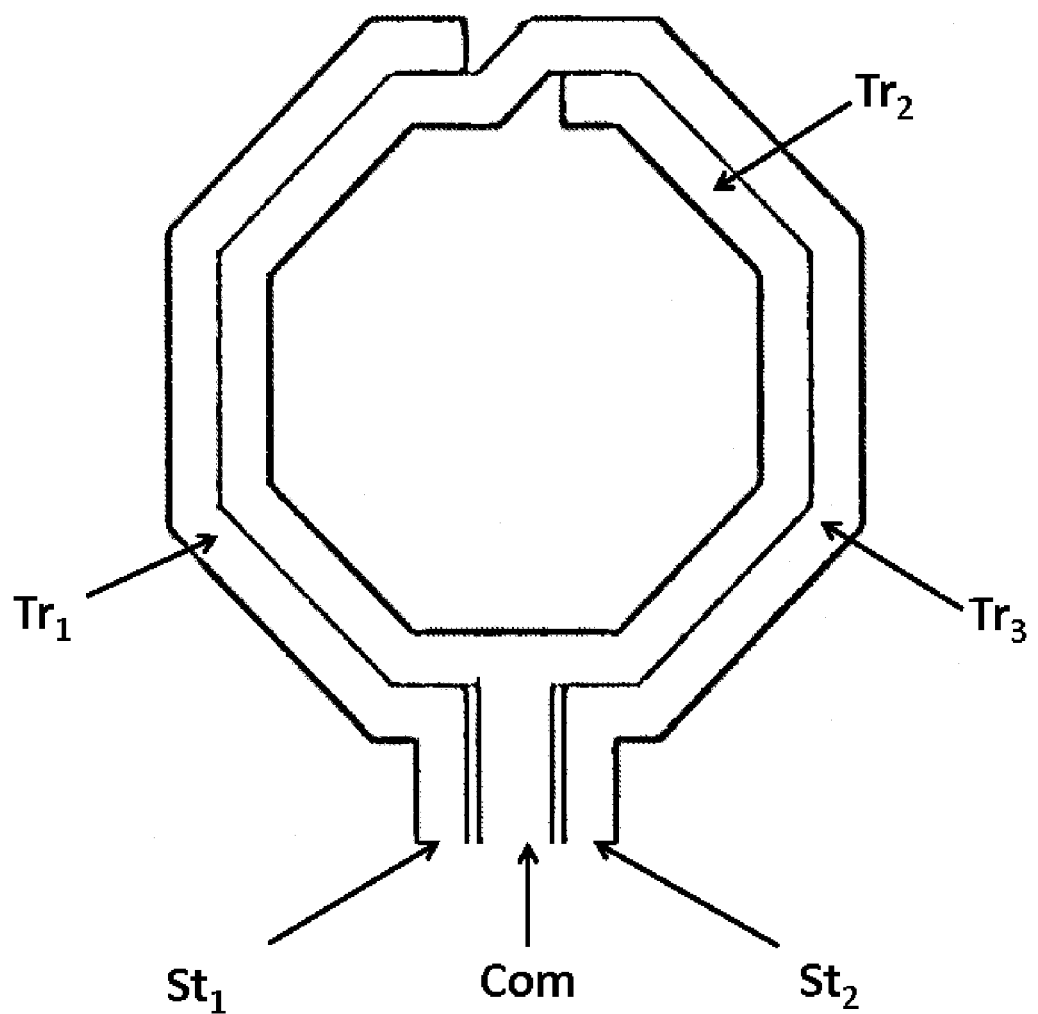
FIG. 20 shows an exemplary embodiment of an inductor physical layout comprising a center tab.

FIG. 20 shows an exemplary embodiment of a physical layout of an inductor comprising a center tab terminal (Com) to provide two substantially same inductance values between terminals (St1, Com) and (St2, Com), such as to be used in the differential embodiment presented in FIG. 14 (e.g. $(L_1)$). The inductor presented in FIG. 20 comprises concentric traces (Tr1, Tr2, Tr3) effectively creating two substantially same circular patterns defined by (St1, Tr1, Tr2, Com) and (St2, Tr3, Com) each creating a same inductance value for a current through terminals (St1, Com) and (St2, Com).

It should again be noted that although the equivalent parallel resistance $R_p$ of a non-ideal LC tank is used to derive the frequency response of a tank, such value is usually not selected as it is inherent to the construction of the inductor L of the tank (e.g. equivalent series resistance Rs of the inductor). In this case, careful design in the construction process of the inductor can minimize such resistance in the inductor. For example, the designer can reduce, to a certain extent, the series resistance by using wider metal width and using a circular geometry, instead of a rectangular geometry, for the inductor design. The skilled person will know of other methods which individually or in combination can result in reduction of the series resistor.

Figure 15A:
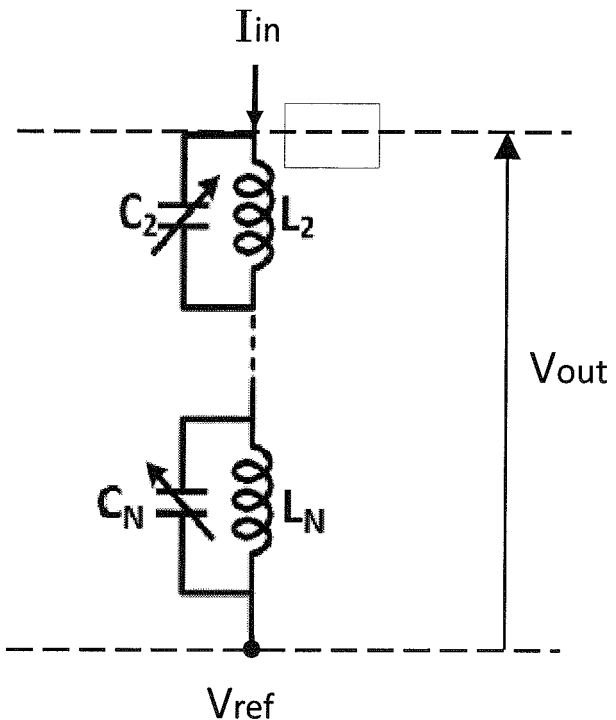
FIGS. 15A and 15B show exemplary embodiments according to the present disclosure of N series connected LC tanks configured to operate in a parallel configuration and a series configuration respectively.
Figure 15B:
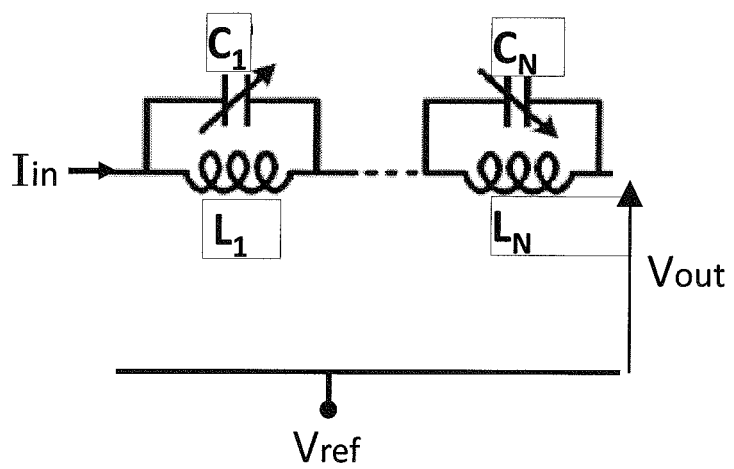

The various embodiments of the N series stacked LC tanks of the present disclosure may be used in various RF circuits requiring wider tuning range and higher dynamic operation. In some embodiments according to the present disclosure, the N series stacked tanks may be used in a parallel configuration, such as depicted in FIG. 15A, or in a series configuration such as depicted in FIG. 15B. The skilled person will know the suitable configuration to use depending on the design on hand.

Figure 16:
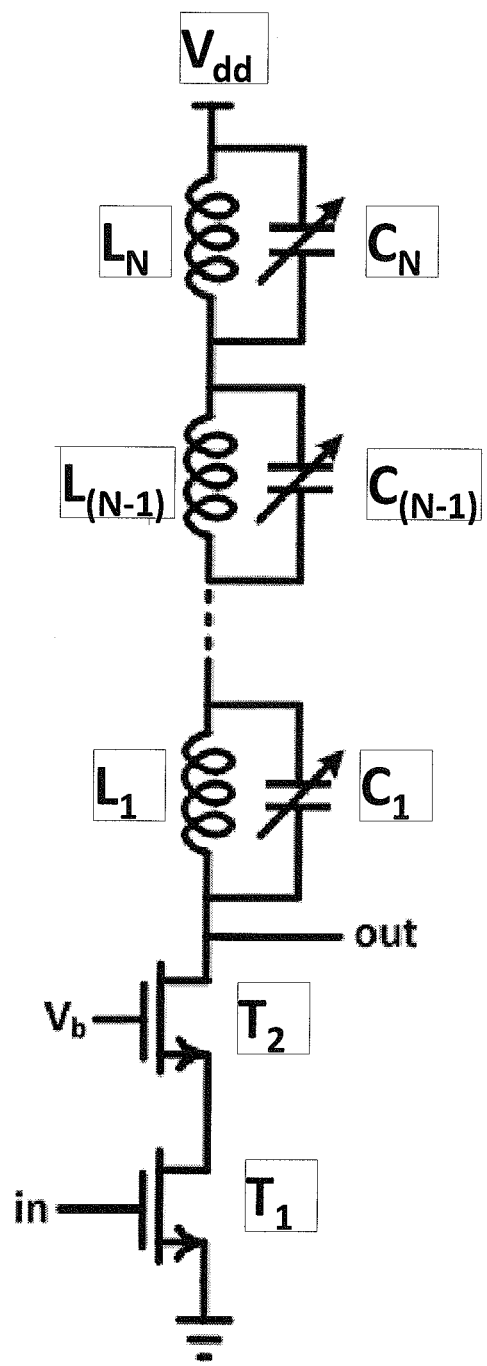
FIG. 16 shows an exemplary embodiment according to the present disclosure of a radio frequency (RF) amplifier using a stacked arrangement of tunable resonant tanks connected in series.

According to an exemplary embodiment of the present disclosure, FIG. 16 shows an amplifier arrangement comprising a cascode amplifier coupled to N series connected stacked LC tanks, where N can be any number larger than one. The amplifier arrangement of FIG. 16 comprises an input FET transistor ($T_1$) connected to an input signal (in), a second FET transistor ($T_2$) coupled serially to the first transistor and providing a gain stage to the amplifier, and the N series connected stacked LC tanks coupled to the drain of the second FET transistor. Transistor ($T_2$) is biased via a biasing signal ($V_b$) fed to the gate of the transistor. Output of the amplifier is provided at the drain of the second transistor which is also coupled to the N stacked LC tanks connected in series. A supply power ($V_{dd}$) provides supply current to the amplifier arrangement through the N series connected stacked LC tanks.

In the amplifier of FIG. 16, tuning of the series connected tunable LC tanks is performed for a desired frequency of operation of the amplifier. This frequency of operation may be selected according to the frequency band within which the input signal (in) to the amplifier arrangement operates. The frequency of operation can be mapped to a passband region (e.g. resonant frequency) of a tunable LC tank of the plurality of tunable LC tanks, which tunable LC tank can then be used for tuning of the amplifier at the frequency of operation. As previously mentioned, frequency response of a given tank (e.g. associated to a desired frequency of operation) of the various tanks of the amplifier may be further enhanced (e.g. larger amplitude response at frequency of operation) by tuning the other tanks in the arrangement so to have lesser impact on the given tank.

According to a further embodiment of the present disclosure, the various tanks of the amplifier arrangement of FIG. 16 can be used to tune different frequency bands. In one embodiment of the present disclosure the various tanks are grouped individually or in combination, to create responses for various (e.g. different) frequency bands. As such, each group always passes a same frequency band amongst the supported frequency bands. In another embodiment the grouping of the tanks may be performed under control of a controller which is aware of the selected frequency band. As such, knowing the frequency of operation the controller may tune the digitally controllable inductors and/or capacitors of the series connected tanks of the arrangement to create a desired response while maintaining a high output voltage swing and linearity across the entire output voltage range. In such a configuration, grouping of the various tanks is not provided a priori and based on a desired set of frequency bands, but rather created on the fly.

In the embodiment of FIG. 16, the average voltage drop across the inductors is zero, and thus the voltage output at the (out) terminal of the amplifier arrangement can substantially be higher than the supply voltage ($V_{dd}$) of the amplifier arrangement. As indicated in prior paragraphs, larger voltage swings while maintaining output signal linearity can be obtained for the amplifier arrangement of FIG. 16 by using a SOI or SOS manufacturing process for the various components of the arrangement.

Therefore and based on the aforementioned, the amplifier arrangement of FIG. 16 can be used to replace various amplifiers tuned at different frequencies to cover multiple wideband frequency applications, such as, for example, 60 GHz/5G Wi-Fi, cellular standards (GSM/EDGE/3G/4G), Wi-Fi/BT/GPS/FM/Cellular, Cognitive radio, UWB, Automotive radar short-range (24-29 GHz and 77-81 GHz) and long-range (76-77 GHz) and other as known by a person skilled in the art.

Figure 17:
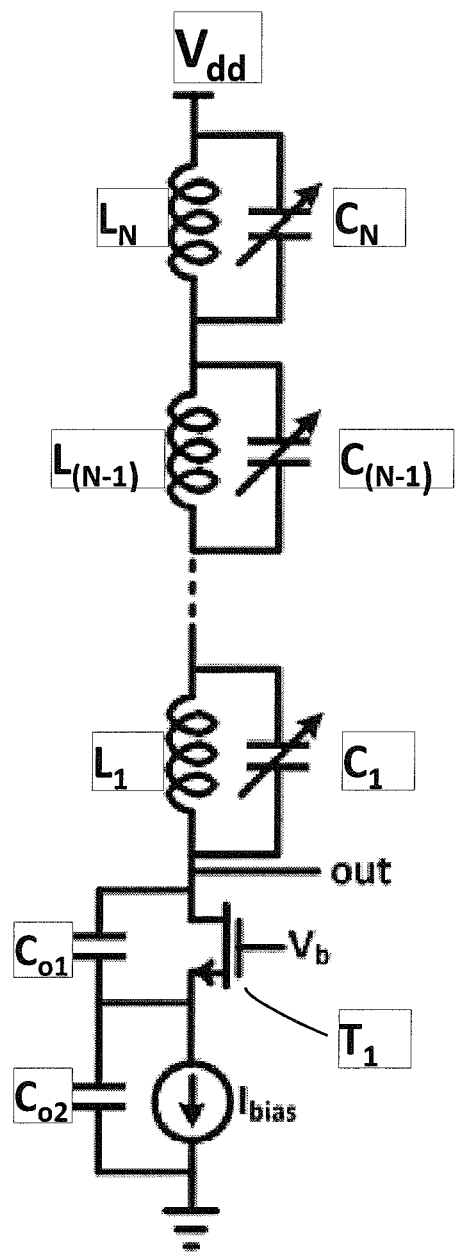
FIG. 17 shows an exemplary embodiment according to the present disclosure of a voltage controlled oscillator (VCO) using a stacked arrangement of tunable resonant tanks connected in series.

According to a further exemplary embodiment of the present disclosure, FIG. 17 shows a voltage controlled oscillator (VCO) whose output frequency is tuned via N series connected LC tanks. The VCO of FIG. 17 comprises a FET transistor ($T_1$), a current source ($I_{bias}$), two charging capacitors ($C_{o1}$) and ($C_{o2}$) and the N series connected LC tanks. A bias voltage ($V_b$) provided to the gate of ($T_1$) controls the current through the current source ($I_{bias}$) which is connected to the source of transistor ($T_1$). Capacitor ($C_{o1}$) is connected across the drain and source terminals of ($T_1$) and capacitor ($C_{o2}$) is connected across the current source ($I_{bias}$). The N series connected LC tanks are connected between the drain terminal of the transistor ($T_1$) and a supply power $V_{dd}$.

It should be noted that throughout the present disclosure, N series connected LC tanks, or N stacked LC tanks, or N series connected tunable LC tanks, or stacked LC tanks, or stacked arrangement of tunable resonant tanks, or stacked non-ideal LC tanks, all refer to a same circuital arrangements and as presented in the various figures of this disclosure, where it always assumed that N is an integer strictly larger than one.

Figure 18:
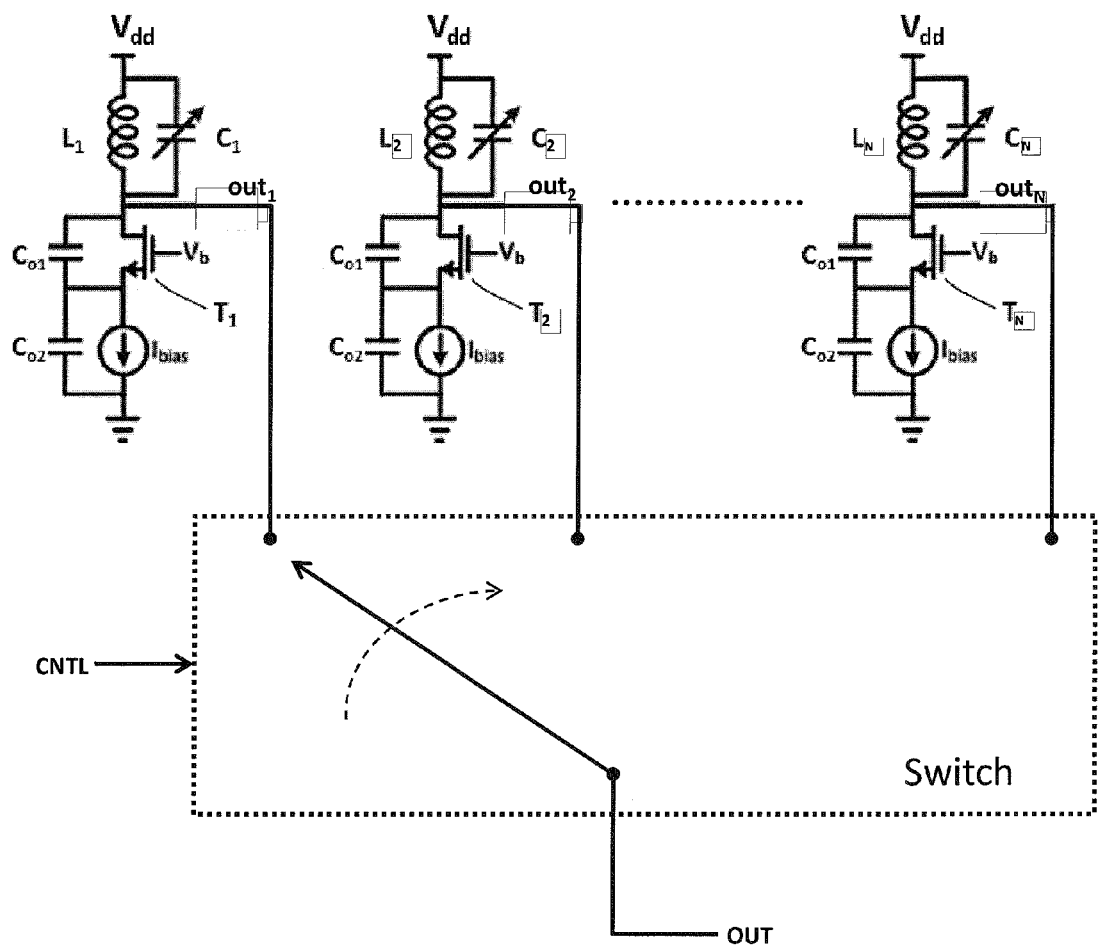
FIG. 18 shows an exemplary prior art embodiment of a VCO arrangement configured for a wide frequency tuning range.
Figure 19:
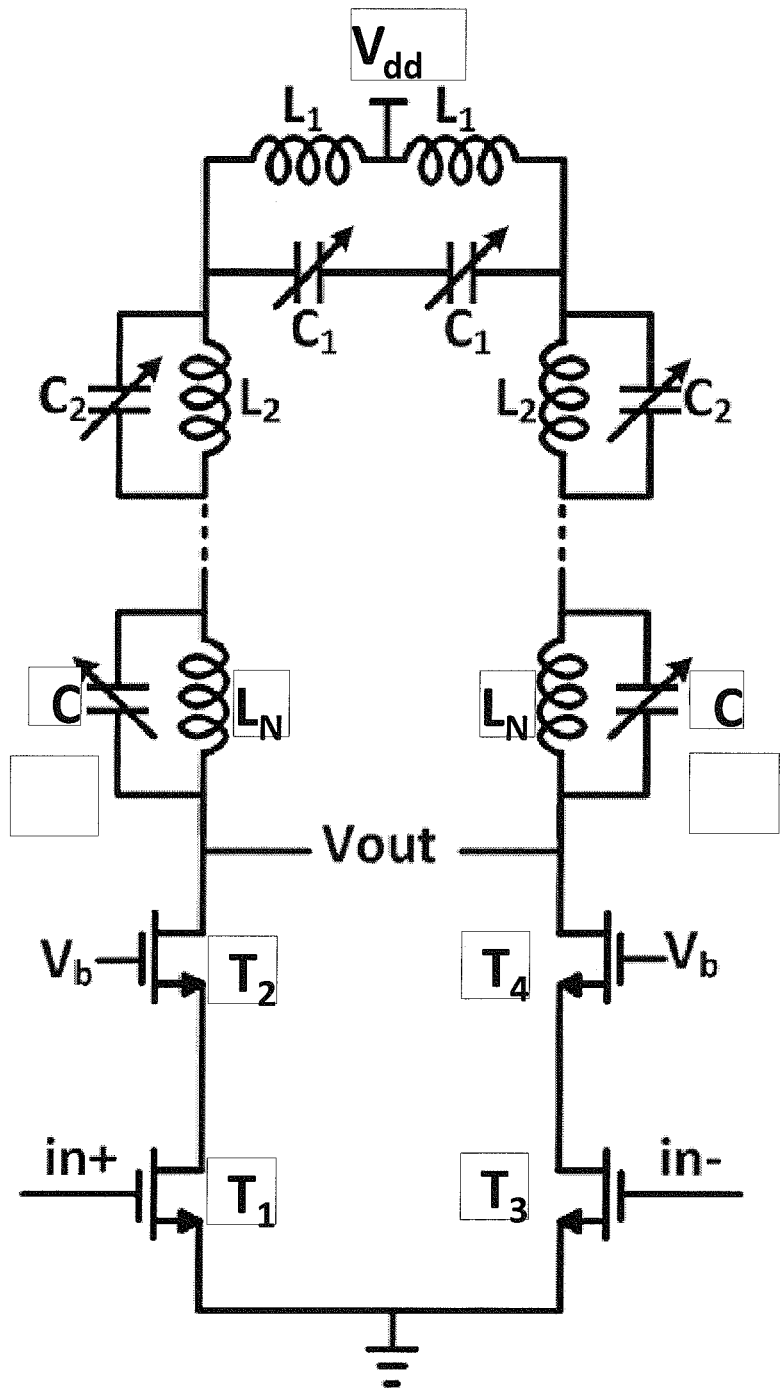
FIG. 19 shows an exemplary embodiment according to the present disclosure of a differential implementation of the embodiment of FIG. 15.

The skilled person will recognize the VCO configuration of FIG. 17 as a conventional Colpitts oscillator wherein a single LC tank is replaced with the N series connected LC tanks. The configuration of FIG. 17 allows tuning to various frequency ranges and/or one or more distinct wideband continuous tuning ranges with higher oscillator output swing while maintaining linearity in the output signal. Tuning of the output frequency of the oscillator in FIG. 17 is done by varying the capacitor $C = Co1 + Co2 + \{C_1, C_2, \ldots, C_N\}$. The VCO configuration of FIG. 17 allows to replace prior art solutions for generating various tunable signals and/or wideband tuning range via oscillators such as one depicted in FIG. 18, wherein various VCOs, each with a single tunable LC tank, are used to generate output signals at various frequencies (e.g. close to each other or overlapping) and a switch to select a desired output signal. The skilled person will appreciate not only the flexibility in tuning provided by the arrangement of FIG. 17, but also its reduced number of components yielding to a reduced form factor and reduced power consumption as well as a shorter signal path for better signal integrity as compared to the implementation of FIG. 18.

According to further embodiments of the present disclosure, monolithic integration of any of the presented arrangements using a process such as CMOS, CMOS SOI, or CMOS SOS is provided. Benefits of SOI and SOS processes include lower parasitic capacitance and thus higher Q-factor for LC tanks implemented using such processes, as well as high transistor stacks (e.g. 3, 4 or greater) and higher breakdown voltages for larger voltage swings. Additional benefits of the SOI and SOS processes are lack of p-n junction diode which allows for better output linearity over a wider output signal range. Although in some embodiments full monolithic integration is performed, according to further embodiments of the present disclosure, partial monolithic integration may be performed, wherein for example some components of the arrangement are not monolithically integrated. The skilled person can envision multitude ways of partitioning the arrangements according to the present embodiments for integration purposes and as fit by certain desired design criteria, while keeping the benefits of the presented embodiments.

Therefore, in accordance with the present disclosure, systems and methods of stacking LC tanks are provided, which allow generating signals with wide tuning range and high voltage swing while maintaining output signal linearity.

The person skilled in the art will be able to extend the teachings of the present disclosure to any type of RF circuitry requiring frequency tuning in a manner similar to what has already been discussed in the present disclosure. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

The invention claimed is:

1. A circuital arrangement comprising a plurality of independently digitally tunable bandpass inductance-capacitance (LC) resonant tanks connected in series, the circuital arrangement exhibiting, in use, an impedance value at a resonant frequency of each digitally tunable LC resonant tank of the plurality of digitally tunable LC resonant tanks, the impedance value being configured to be larger than or equal to a desired impedance value and substantially equal to the impedance value of each tunable LC resonant tank.

2. The circuital arrangement of claim 1, wherein each independently digitally tunable bandpass LC resonant tank comprises a tuning element comprising one of: a) a digitally variable capacitor, b) a digitally variable inductor, and c) a digitally variable capacitor and a digitally variable inductor, the tuning element being configured to tune the resonant frequency of each such independently digitally tunable bandpass LC resonant tank within a tuning range.

3. The circuital arrangement of claim 2, wherein tuning of the resonant frequency is configured to affect the impedance value of the circuital arrangement linearly.

4. The circuital arrangement of claim 2, wherein the impedance value of the circuital arrangement at the resonant frequency of each independently digitally tunable bandpass LC resonant tank is larger than or equal to the desired impedance value within an entire tuning range of each independently digitally tunable bandpass LC resonant tank.

5. The circuital arrangement of claim 4, wherein two or more independently digitally tunable bandpass LC resonant tanks of the plurality of independently digitally tunable LC resonant tanks are configured to provide overlapping tuning ranges, in order to provide a wider tuning range.

6. The circuital arrangement of claim 4, wherein tuning of a first independently digitally tunable bandpass LC resonant tank of the plurality of independently digitally tunable bandpass LC resonant tanks is configured to maximize the impedance value of the circuital arrangement at a resonant frequency of a second independently digitally tunable bandpass LC resonant tank of the plurality of independently digitally tunable bandpass LC resonant tanks.

7. The circuital arrangement of claim 5, wherein tuning of a first independently digitally tunable bandpass LC resonant tank of the two or more independently digitally tunable bandpass LC resonant tanks is configured to maximize the impedance value of the circuital arrangement at a resonant frequency of a second independently digitally tunable bandpass LC resonant tank of the two or more independently digitally tunable bandpass LC resonant tanks.

8. The circuital arrangement of any one of claims 1-7, fabricated entirely or partially using one of: a) silicon on insulator (SOI) technology, and b) silicon on sapphire (SOS) technology.

9. A frequency tuning amplifier arrangement comprising an amplifier and the circuital arrangement according to any one of claims 1-7, operatively coupled to an output terminal of the amplifier, wherein said circuital arrangement tunes the amplifier to a desired frequency of operation.

10. The frequency tuning amplifier of claim 9, fabricated entirely or partially using one of: a) silicon on insulator (SOI) technology, and b) silicon on sapphire (SOS) technology.

11. A tunable voltage controlled oscillator (VCO) comprising the circuital arrangement according to any one of claims 1-7, wherein said circuital arrangement provides frequency tuning of the VCO.

12. The tunable VCO of claim 11 fabricated entirely or partially using one of: a) silicon on insulator (SOI) technology, and b) silicon on sapphire (SOS) technology.

13. A radio frequency circuital arrangement comprising the circuital arrangement according to any one of claims 1-7, wherein said circuital arrangement tunes an operation of the radio frequency circuital arrangement at a frequency of operation.

14. The radio frequency circuital arrangement of claim 13, fabricated entirely or partially using one of: a) silicon on insulator (SOI) technology, and b) silicon on sapphire (SOS) technology.

15. The circuital arrangement according to any one of claims 1-7, configured for differential input/output operation.

16. A radio frequency circuital arrangement configured for differential input/output operation comprising the circuital arrangement of claim 15.

17. The radio frequency circuital arrangement of claim 16, fabricated entirely or partially using one of: a) silicon on insulator (SOI) technology, and b) silicon on sapphire (SOS) technology.

18. The radio frequency circuital arrangement according to claim 17, wherein a first inductor/capacitor of a first independently digitally tunable bandpass LC resonant tank of the plurality of independently digitally tunable bandpass LC tanks and a second inductor/capacitor of a second independently digitally tunable bandpass LC tank of the plurality of independently digitally tunable bandpass LC tanks are physically combined, the first and second independently digitally tunable bandpass LC resonant tanks being in correspondence to an alternate current (AC) ground potential of the plurality of independently digitally tunable bandpass LC resonant tanks during differential operation of the radio frequency circuital arrangement.

19. A method for tuning an amplitude response of a radio frequency (RF) circuit at a frequency of operation, the method comprising:
providing the RF circuit;
providing one or more different frequency ranges for the frequency of operation of the RF circuit;
providing a plurality of series-connected tunable LC tanks, wherein each series-connected tunable LC tank is independently digitally tunable and is configured as a bandpass filter having a passband region;
configuring the series-connected tunable LC tanks according to the provided different frequency ranges;
operatively coupling the series-connected tunable LC tanks to the RF circuit;
tuning the series-connected tunable LC tanks; and
based on the tuning of the series-connected tunable LC tanks, tuning the amplitude response of the RF circuit at the desired frequency of operation.

20. The method of claim 19, further comprising:
providing a desired minimum output signal voltage swing of the series-connected tunable LC tanks at the frequency of operation;
providing a desired maximum current input to the series-connected tunable LC tanks at the frequency of operation;
based on the providing and the providing, deriving a minimum impedance value of the series-connected tunable LC tanks at the frequency of operation;
based on the deriving, configuring the series-connected tunable LC tanks to provide an impedance value of the series-connected tunable LC tanks equal to or larger than the minimum impedance value at the frequency of operation; and
based on the deriving, obtaining a desired minimum output voltage swing at the frequency of operation, wherein the frequency of operation is any frequency from the one or more different frequency ranges.

21. The method of claim 20, wherein the configuring of the series-connected tunable LC tanks to provide an impedance value of the series connected tunable LC tanks at the frequency of operation further comprises:
mapping the frequency of operation to a resonant frequency of a first tunable LC tank of the series-connected tunable LC tanks;
tuning the first tunable LC tank;
based on the tuning of the first tunable LC tank, obtaining a higher impedance value of the series-connected tunable LC tanks at the frequency of operation;
tuning a second tunable LC tank of the series-connected tunable LC tanks different from the first tunable LC tank;
based on the tuning of the second tunable LC tank, increasing the higher impedance value of the N series connected tunable LC tanks at the frequency of operation; and based on the increasing, obtaining at the frequency of operation an impedance value of the series-connected tunable LC tanks equal to or larger than the minimum impedance value.

22. The method of claim 20, further comprising:
providing a wider frequency range of the one or more different frequency ranges;
based on the providing, configuring two or more tunable LC tanks of the series-connected tunable LC tanks;
based on the configuring, overlapping passband regions of the two or more tunable LC tanks;
based on the overlapping, obtaining a wider passband region; and
based on the obtaining, providing an impedance value of the series-connected tunable LC tanks equal or larger to the minimum impedance value for any frequency of operation from the wider frequency range.

23. A method for providing a multiple band radio frequency (RF) circuit, the method comprising:
providing an RF circuit;
providing N center frequencies corresponding to N bands of operation, wherein N is a number larger than one;
providing a N series-connected tunable LC tanks, wherein each series-connected tunable LC tank is independently digitally tunable and is configured as a bandpass filter;
configuring the N series-connected tunable LC tanks according to the provided center frequencies wherein the N resonant frequencies of the N series-connected tunable LC tanks are in correspondence of the N center frequencies;
operatively coupling the N series connected tunable LC tanks to the RF circuit;
based on the coupling, providing a passband region to a signal corresponding to a band of operation; and
based on the coupling, providing an attenuation region to a signal outside a band of operation.

24. A method for providing a wider tuning range for a radio frequency (RF) circuit, the method comprising:
providing an RF circuit comprising an N series-connected tunable LC tanks configured to affect an output signal of the RF circuit, wherein each series-connected tunable LC tank is independently digitally tunable and is configured as a bandpass filter having a passband region;
configuring two or more tunable LC tanks of the N series connected tunable LC tanks;
based on the configuring, overlapping passbands regions of the two or more tunable LC tanks;
based on the overlapping, obtaining a wider passband region wherein an output voltage of the output signal is larger than a minimum desired voltage; and
based on the obtaining, obtaining a wider tuning range for the RF circuit.

25. A multiple bandpass filter circuital arrangement comprising a plurality of tunable inductance-capacitance (LC) resonant tanks connected in series, wherein each tunable LC resonant tank of the plurality of tunable LC resonant tanks is independently digitally tunable and configured to have a different passband region about a different resonance frequency.

26. The multiple bandpass filter circuital arrangement of claim 25, the circuital arrangement exhibiting, in use, an impedance value at a resonant frequency of each tunable LC resonant tank of the plurality of tunable LC resonant tanks, the impedance value being configured to be larger than or equal to a desired impedance value and substantially equal to the impedance value of the each tunable LC resonant tank.

27. The multiple bandpass filter circuital arrangement of claim 25, wherein each tunable LC resonant tank comprises a digital tuning element comprising one of: a) a variable capacitor, b) a variable inductor, and c) a variable capacitor and a variable inductor, the tuning element being configured to tune the resonant frequency of each tunable LC resonant tank within a tuning range.

28. The multiple bandpass filter circuital arrangement of claim 25, wherein two or more tunable LC resonant tanks of the plurality of LC resonant tanks are configured to provide partially overlapping passband regions.

29. The multiple bandpass filter circuital arrangement of claim 25, fabricated entirely or partially using one of: a) silicon on insulator (SOI) technology, and b) silicon on sapphire (SOS) technology.

30. A frequency tuning amplifier arrangement comprising an amplifier and the multiple bandpass filter circuital arrangement according to any one of claims 25-29, operatively coupled to an output terminal of the amplifier, wherein said multiple bandpass filter circuital arrangement tunes the amplifier to a frequency regions of operation.

31. A radio frequency circuital arrangement comprising the multiple bandpass filter circuital arrangement according to any one of claims 25-29, wherein said multiple bandpass filter circuital arrangement tunes an operation of the radio frequency circuital arrangement at frequency regions of operation.

32. The multiple bandpass filter circuital arrangement according to any one of claims 25-29, wherein each tunable LC resonant tank comprises a digital tuning element comprising one of: a) a variable capacitor, b) a variable inductor, and c) a variable capacitor and a variable inductor.

* * * * *